(12) United States Patent
Akutsu et al.

(10) Patent No.: US 11,862,504 B2
(45) Date of Patent: Jan. 2, 2024

(54) MASK-INTEGRATED SURFACE PROTECTIVE TAPE, AND METHOD OF PRODUCING A SEMICONDUCTOR CHIP USING THE SAME

(71) Applicant: FURUKAWA ELECTRIC CO., LTD., Tokyo (JP)

(72) Inventors: Akira Akutsu, Tokyo (JP); Tomoaki Uchiyama, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/549,910

(22) Filed: Aug. 23, 2019

(65) Prior Publication Data
US 2019/0378747 A1    Dec. 12, 2019

Related U.S. Application Data

(63) Continuation of application No. PCT/JP2018/006503, filed on Feb. 22, 2018.

(30) Foreign Application Priority Data

Feb. 24, 2017    (JP) .................................. 2017-034164

(51) Int. Cl.
*H01L 21/683* (2006.01)
*H01L 21/3065* (2006.01)
*H01L 21/308* (2006.01)
*H01L 21/82* (2006.01)

(52) U.S. Cl.
CPC ...... *H01L 21/6836* (2013.01); *H01L 21/3081* (2013.01); *H01L 21/3086* (2013.01); *H01L 21/30655* (2013.01); *H01L 21/82* (2013.01)

(58) Field of Classification Search
CPC .......... H01L 21/6936; H01L 21/30655; H01L 21/3081; H01L 21/3086; H01L 21/82
See application file for complete search history.

(56) References Cited

U.S. PATENT DOCUMENTS 4,940,851 A * 7/1990 Oyobe ..................... G03F 1/22
                                                                    501/56
2019/0295851 A1* 9/2019 Nishikawa .............. H01L 21/78

FOREIGN PATENT DOCUMENTS

| JP | 2007-19385 A | 1/2007 |
| JP | 2009-33156 A | 2/2009 |
| JP | 2015-52836 A | 3/2015 |

(Continued)

OTHER PUBLICATIONS

Korean Office Action dated Oct. 7, 2020, in a counterpart Korean patent application No. 10-2020-7026341. (A machine translation (not reviewed for accuracy) attached.).

(Continued)

*Primary Examiner* — Evren Seven
(74) *Attorney, Agent, or Firm* — CHEN YOSHIMURA LLP

(57) ABSTRACT

A mask-integrated surface protective tape, which has at least a substrate film and a mask material layer, wherein the mask material layer is provided directly on the substrate film, or is provided on the substrate film through a temporary-adhesive layer, and wherein a parallel ray transmittance of the mask material layer at a wavelength region of 355 nm is 30% or less; and a method of producing a semiconductor chip.

4 Claims, 6 Drawing Sheets

(56) References Cited

FOREIGN PATENT DOCUMENTS

| JP | 2016-115787 A | 6/2016 |
|----|---------------|--------|
| JP | 2016-171263 A | 9/2016 |
| JP | 6034522 B1 | 11/2016 |

OTHER PUBLICATIONS

Korean Office Action dated Jul. 16, 2020, in a counterpart Korean patent application No. 10-2019-7002695. (A machine translation (not reviewed for accuracy) attached.).
International Search Report (ISR) issued in PCT/JP2018/006503 dated May 2018.
Written Opinion (PCT/ISA/237) issued in PCT/JP2018/006503 dated May 2018. (Concise Explanation of Relevance: This Written Opinion considers that the some of claims are not described by or obvious over the Foreign Patent Document.).
Japanese Office Action dated Sep. 7, 2021, in a counterpart Japanese patent application No. 2018-535436. (A machine translation (not reviewed for accuracy) attached.).
Chinese Office Action dated Oct. 13, 2022, in a counterpart Chinese patent application No. 201880002974.X. (A machine translation (not reviewed for accuracy) attached.).
Chinese Office Action dated Aug. 1, 2023, in a counterpart Chinese patent application No. 201880002974.X. (A machine translation (not reviewed for accuracy) attached.).

* cited by examiner

MASK-INTEGRATED SURFACE PROTECTIVE TAPE, AND METHOD OF PRODUCING A SEMICONDUCTOR CHIP USING THE SAME

TECHNICAL FIELD

The present invention relates to a mask-integrated surface protective tape, and a method of producing a semiconductor chip using the same.

BACKGROUND ART

In recent years, remarkable evolution has made on the thinning of the semiconductor chip and the downsizing of the chip. In particular, the thinning is required in the IC cards with built-in semiconductor IC chips, such as a memory card and a smart card. Further, the downsizing of the chip is required in LED or LCD driving devices and the like. With the increase in these demands from now, the needs for the thinning of the semiconductor chip and the downsizing of the chip are thought of as being increased much more.

These semiconductor chips are obtained, by thinning a semiconductor wafer to a predetermined thickness in a backgrinding step, an etching step or the like, and then dividing the semiconductor wafer into individual chips through a dicing step.

In the past, in this dicing step, a blade dicing method of cutting the semiconductor wafer with a dicing blade has been used. However, in this blade dicing method, the cutting resistance by the blade is put directly on the semiconductor wafer at the time of cutting, so that a microscopic crack (or chipping) sometimes occurs in the semiconductor chip by this cutting resistance. Occurrence of the chipping does not only deteriorate outer appearance of the semiconductor chip, but also in some cases, there is a risk that even a circuit pattern on the chip is damaged, for example, a damage of chips is occurred due to lack (or insufficiency) of the transverse strength (or deflective strength) at the time of picking up. Further, in the foregoing physical dicing step using such a blade, it is impossible to set the width of a kerf (also referred to as a scribe line or a street, or prescribed dicing lines) which is an interval between chips to less than the thick blade width. As a result, the number (yield) of chips gotten from a sheet of wafer decreases. Further, a long time period to be taken for the processing of the wafer is also a problem.

In the dicing step, use is also made of any of various kinds of methods, other than the blade dicing method. For example, there are representatives that: 1) a DBG (i.e. dicing before grinding) method of forming in first a groove with a predetermined thickness in the wafer, and then carrying out a grinding step, and thereby for achieving both the thinning and the singulation into chips at the same time, 2) a laser dicing method of carrying out a dicing step with a laser, 3) a method using a wet process, such as a water-jet method of carrying out a dicing step with a water pressure, 4) a stealth dicing method of forming a modifying layer with a laser in the thickness direction of the wafer, and then splitting the modifying layer by expansion to singulate the wafer, 5) a combined method of the stealth dicing and the dicing before grinding, and the like.

These methods each individually have a merit. However, these methods have disadvantages, such as breakage of the chip, a prolonged time required for production of the microchip, a surface contamination, restriction to narrowing of a kerf width, lowering of yield in the chip to be obtained, lowering of transverse strength of the chip, and crack of the chip corner caused by collision of an end-face of the chip with an adjacent chip.

In addition to the above methods, there is 6) a plasma dicing method (for example, see Patent Literature 1).

The plasma dicing method is a method of dividing a semiconductor wafer, by selectively etching with plasma a portion which is not covered with a mask. When this dicing method is used, segmentation of chips can be achieved selectively, and even if the scribe line is curved, the segmentation is possible with no trouble. Further, as the etching speed is very high, in recent years, this dicing method is considered one of the most suitable steps for the segmentation into chips.

In the plasma dicing method, use is made of, as a plasma generating gas, a fluorine-based gas which has a very high reactivity with a wafer, such as sulfur hexafluoride ($SF_6$) and carbon tetrafluoride ($CF_4$). For this reason, a protection for a non-etched surface with a mask against, such a high etching speed, is necessary. Therefore, a preliminary mask formation becomes necessary.

In order to form the mask, as described in Patent Literature 1, generally the technique is used which consists of: coating a resist on the surface of the wafer; and then removing the portion corresponding to a street by a photolithography, to form the mask. Therefore, in order to carry out the plasma dicing, it is required for a facility for the photolithographic step other than the plasma dicing facility. For this reason, there is a problem of increase in chip costs. Further, because of being in a state that a mask (resist film) is remaining after the plasma-etching, it is necessarily to use a large amount of solvent to remove the mask. Nevertheless, the removal of the mask is not always completely performed, which sometimes resulted in occurrence of defective chips. Further, there is also a disadvantage that an overall processing process gets longer period, because of undergoing a masking step with a resist.

CITATION LIST

Patent Literature

Patent Literature 1: JP-A-2007-19385 ("JP-A" means unexamined published Japanese patent application)

SUMMARY OF INVENTION

Technical Problem

In the plasma dicing method, since the portion corresponding to a street/dicing lines is removed by a photolithography process to form the mask resist as above, the problems described above arise. The inventors of the present invention, therefore, have considered a mask-integrated surface protective tape that eliminates the need for a mask formation by the resist described above, by providing a mask material layer having a mask function on a surface protective tape to use.

The use of the mask-integrated surface protective tape allows production of a semiconductor chip through at least the following steps:

[Steps]
 (A) a supporting and fixing step of attaching a surface protective tape to a ring frame after grinding a backing-face (bottom surface) of the semiconductor wafer that is opposite to a patterned surface on which the surface protective tape has been laminated;

(B) an opening step of cutting a street portion of the semiconductor wafer by laser cut for the mask material layer which has been surface-exposed by peeling;
(C) a plasma-dicing step; and,
(D) an ashing step of ashing a remaining mask material layer.

The Step (A) requires a property of protecting a patterned surface effectively due to a good adhesion to the patterned surface of the semiconductor wafer. The Step (B) requires an easy and good peeling property between a mask material layer and a layer adjacent to this layer (in a case of having a temporary-adhesive layer, the adjacent layer is the temporary-adhesive layer, whereas in a case of having no temporary-adhesive layer, the adjacent layer is a substrate film or the like) after a thin-film processing of the wafer, and openability of the street of the semiconductor wafer with a high degree of precision which is achieved by cutting a portion of the mask material layer corresponding to the street of the semiconductor wafer with a laser. The Step (C) requires a performance of protecting a wafer from irradiation plasma, such as $SF_6$ plasma. Further, the Step (D) requires removal property (or removability) of the mask material layer by irradiation plasma, such as $O_2$ plasma.

Accordingly, the present invention is contemplated for providing a mask-integrated surface protective tape that eliminates the need for a mask formation by photolithography process in the production of a semiconductor chip using a plasma dicing method, and that exhibits an excellent performance in each of the production steps of the semiconductor chip, and also that is excellent in both operability and activity; and it is contemplated for providing a method of producing a semiconductor chip using this mask-integrated surface protective tape.

In particular, a problem to overcome which is caused by providing a mask material layer in the present invention is to achieve excellence of any of a peeling property for exposing the mask material layer on top, cuttability by laser opening, and removability by plasma ashing with $O_2$ and the like, and so the present invention is contemplated for providing a mask-integrated surface protective tape that is excellent in at least these performances and for providing a method of producing a semiconductor chip by using this mask-integrated surface protective tape.

Solution to Problem

The above-described problems of the present invention are solved by the following means:

[1] A mask-integrated surface protective tape, which has at least a substrate film and a mask material layer, wherein the mask material layer is provided directly on the substrate film, or is provided on the substrate film through a temporary-adhesive layer, and
wherein a parallel ray transmittance of the mask material layer at a wavelength region of 355 nm is 30% or less.
  [2] The mask-integrated surface protective tape as described in [1], wherein a content of an ultraviolet absorber in the mask material layer is from 0.1 to 5.0 mass parts, with respect to 100 mass parts of a (meth) acrylic copolymer, or a content of an ultraviolet-absorbing polymer in the mask material layer is from 5.0 to 50.0 mass parts, with respect to 100 mass parts of a (meth)acrylic copolymer.
  [3] The mask-integrated surface protective tape as described in [1] or [2], wherein the mask material layer comprises at least one kind of ultraviolet absorber, and wherein the ultraviolet absorber is a compound having a skeleton selected from the group consisting of a triazine skeleton, a benzophenone skeleton, a benzotriazole skeleton, or a benzoate skeleton.
  [4] The mask-integrated surface protective tape as described in [1] or [2], wherein the mask material layer comprises at least one ultraviolet absorbing polymer, and wherein the ultraviolet absorbing polymer is a (meth)acrylic polymer having an ultraviolet-absorbing skeleton selected from the group consisting of a benzotriazole skeleton, a benzophenone skeleton, or a triazine skeleton in the side chain thereof.
  [5] The mask-integrated surface protective tape as described in any one of [1] to [4], wherein a mask material constituting the mask material layer is radiation-curable.
  [6] The mask-integrated surface protective tape as described in any one of [1] to [5], wherein the mask-integrated surface protective tape comprises the substrate film and the mask material layer provided thereon through the temporary-adhesive layer, and wherein a temporary-adhesive that constitutes said temporary-adhesive layer is of a pressure-sensitive type.
  [7] The mask-integrated surface protective tape as described in any one of [1] to [6], wherein the substrate film comprises a polyolefin-based resin layer.
  [8] The mask-integrated surface protective tape as described in any one of [1] to [7], which is used in plasma dicing.
  [9] The mask-integrated surface protective tape as described in any one of [1] to [8], which is used in a production of a semiconductor chip including the following Steps (a) to (d):
[Steps]
  (a) a step of, in the state of having laminated the mask-integrated surface protective tape on the side of a patterned surface of a semiconductor wafer, grinding the backing-face of the semiconductor wafer; laminating a wafer-fixing tape on the backing-face side of the ground semiconductor wafer; and supporting and fixing the semiconductor wafer to a ring frame;
  (b) a step of, after peeling the substrate firm or integrally peeling both the substrate film and the temporary-adhesive layer from the mask-integrated surface protective tape, thereby to expose the mask material layer on top, forming an opening by cutting a portion of the mask material layer corresponding to a street of the semiconductor wafer with a laser;
  (c) a plasma-dicing step of segmentalizing the semiconductor wafer on the street by a $SF_6$ plasma, and thereby for singulating the semiconductor wafer into semiconductor chips; and
  (d) an ashing step of removing the mask material layer by an $O_2$ plasma.
  [10] A method of producing a semiconductor chip, comprising: using the mask-integrated surface protective tape as described in any one of [1] to [9].

In another aspect, the present disclosure provides a method of separating a semiconductor wafer into a plurality semiconductor chips using a mask-integrated surface protective tape that includes a mask material layer and a substrate film, wherein the mask material layer is attached directly to the substrate film, or is attached to the substrate film through a temporary-adhesive layer interposed therebetween, the method comprising: laminating the mask-integrated surface protective tape on a patterned top surface of a semiconductor wafer with the mask material layer in direct contact with the patterned top surface of the semiconductor wafer; grinding a bottom surface of the semiconductor wafer that is opposite to the patterned surface to thin the semiconductor wafer from a bottom thereof while protecting the patterned top surface by the laminated mask-integrated surface protective tape; laminating a wafer-fixing tape on the ground bottom surface of the semiconductor wafer; thereafter, attaching the wafer-fixing tape to a ring frame so as to support the ground semiconductor wafer via the ring frame; thereafter, peeling off the substrate film, or the substrate film and the temporary-adhesive layer, from the mask-integrated surface protective tape so as to expose a surface of the mask material layer; radiating a laser beam along prescribed dicing lines to the exposed surface of the mask material layer to laser-cut the mask material layer along the prescribed dicing lines, thereby patterning the mask material layer; thereafter, exposing the semiconductor wafer having the patterned mask material layer thereon to a plasma to perform a plasma dicing of the semiconductor wafer using the patterned mask material layer as a mask; removing the mask material layer; and separating the diced semiconductor wafer from the wafer-fixing tape so as to produce a plurality of separated semiconductor chips.

Effects of Invention

The mask-integrated surface protective tape of the present invention can be provided for eliminating the need for a mask formation by photolithography process in production of the semiconductor chip using a plasma dicing method.

By this, it becomes possible to provide of both: a mask-integrated surface protective tape that exhibits excellent performances in each of production steps of the semiconductor chip and also that is excellent in both operability and activity; and a method of producing a semiconductor chip by using this mask-integrated surface protective tape.

In particular, a problem to overcome which is caused by providing a mask material layer is to achieve excellence of any of a peeling property for exposing the mask material layer on top, cuttability by laser opening, and removability by plasma ashing with $O_2$ and the like.

As a result, the mask-integrated surface protective tape of the present invention, allows prevention of the following problems, particularly in the step of cutting a portion of the mask material corresponding to a street of a semiconductor wafer by laser, thereby to form an opening of the street of the semiconductor wafer. That is, this allows prevention of the problems such as reduction in laser processing efficiency due to lack of laser light absorption performance of the mask material layer, to lead to a prolongation of processing time; and deterioration of wafer processing quality as a result of fusion of the mask material layer due to an energy input (irradiation) of the excessive laser light.

Other and further features and advantages of the invention will appear more fully from the following description, appropriately referring to the accompanying drawings.

BRIEF DESCRIPTION OF DRAWINGS

FIG. 1(a) shows a semiconductor wafer, fragmentary FIG. 1(b) shows how the mask-integrated surface protective tape is laminated onto the semiconductor wafer, and fragmentary FIG. 1(c) shows a semiconductor wafer on which the mask-integrated surface protective tape is laminated.

FIG. 2(a) shows thinning step of the semiconductor wafer, fragmentary FIG. 2(b) shows how a wafer-fixing tape is laminated, and fragmentary FIG. 2(c) shows a state in which the semiconductor wafer is fixed to a ring frame.

FIG. 3(a) shows how the surface protective tape is peeled off from the mask-integrated surface protective tape while leaving the mask material layer, fragmentary FIG. 3(b) shows a state in which the mask material layer of the mask-integrated surface protective tape is exposed (uncovered), and fragmentary FIG. 3(c) shows a step of cutting off the mask material layer corresponding to the street with a laser.

FIG. 4(a) shows how the plasma dicing is carried out, fragmentary FIG. 4(b) shows a state in which the semiconductor wafer is singulated into chips, and fragmentary FIG. 4(c) shows how the plasma ashing is carried out.

FIG. 5(a) shows a state, in which the mask material layer is removed, and fragmentary FIG. 5(b) shows how the chip is picked up.

FIG. 6(a) shows a state in which the respective side of the front or the back of the semiconductor wafer is covered and fixed with the mask-integrated surface protective tape or the wafer-fixing tape, respectively. Fragmentary FIG. 6(b) shows how an ultraviolet light is irradiated. Fragmentary FIG. 6(c) shows how the surface protective tape is peeled off from the mask-integrated surface protective tape while leaving the mask material layer.

MODE FOR CARRYING OUT THE INVENTION

Figure 1A:
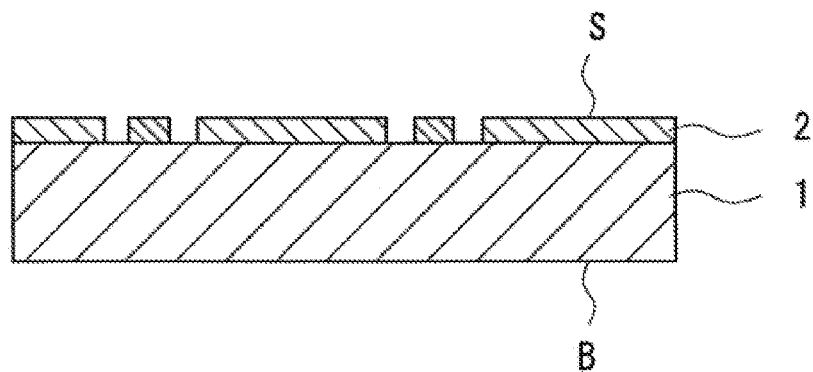
FIGS. 1(a) to 1(c) each are a schematic outline cross-sectional view illustrating the mask-integrated surface protective tape of the present invention and a schematic outline cross-sectional view illustrating steps to laminating a mask-integrated surface protective tape onto a semiconductor wafer in the first embodiment. In those views, fragmentary

The mask-integrated surface protective tape of the present invention is used for the method of obtaining a semiconductor chip by dividing and singulating a semiconductor wafer with plasma dicing. As described below, by using the mask-integrated surface protective tape of the present invention, a photolithography process prior to the plasma dicing step becomes unnecessary, whereby production costs of the semiconductor chips and the semiconductor products can be largely suppressed.

<<Mask-Integrated Surface Protective Tape>>

The mask-integrated surface protective tape of the present invention has at least a substrate film and a mask material layer.

The mask material layer may be provided directly on the substrate film, or may be provided on the substrate film through a temporary-adhesive layer (that is, the substrate film and the mask material layer may be provided facing each other across the temporary-adhesive layer).

Note, in the present invention and the present specification, that a tape in which a temporary-adhesive layer is provided on a substrate film without a mask material layer is referred to simply as a surface protective tape, while a tape having a mask material layer is referred to as a mask-integrated surface protective tape.

In order to protect a patterned surface (front surface) of the semiconductor wafer at the time of backgrinding of the semiconductor wafer, the mask-integrated surface protective tape of the present invention is used to laminate it on the patterned surface.

Accordingly, performances are required, including the same adhesion property as an ordinary semiconductor wafer-processing surface protective tape.

In particular, the mask-integrated surface protective tape has a function of protecting a semiconductor device formed on the patterned surface of the semiconductor wafer. Specifically, at the wafer-thinning step (backgrinding step) which is a post-step, the semiconductor wafer is supported by the patterned face, and the backing-face of the semiconductor wafer is ground. Therefore, the mask-integrated surface protective tape needs to withstand a load in grinding. For this reason, the mask-integrated surface protective tape is different from a mere resist film or the like, and has: the thickness enough to coat the device formed on the patterned face; and the pressing resistance which is low, and has: a high adhesiveness that can adhere tightly to the device, so that the infiltration of dusts, grinding water, and the like, in grinding, is not occurred.

In addition to the above, the mask-integrated surface protective tape of the present invention is suitable for a plasma dicing method, and can eliminate the need for a mask formation by photolithography process in production of the semiconductor chip using a plasma dicing method.

In particular, the mask-integrated surface protective tape of the present invention allows production of a semiconductor chip including at least the following Steps (a) to (d) in the steps of the production of the semiconductor chip, and is preferably applied to said steps of the production of the semiconductor chip.

[Steps (a) to (d)]
(a) A step of, in the state of having laminated the mask-integrated surface protective tape on the side of a patterned surface of a semiconductor wafer, grinding the backing-face of the semiconductor wafer; laminating a wafer-fixing tape on the backing-face side of the ground semiconductor wafer; and supporting and fixing the wafer to a ring frame;
(b) a step of, after peeling the substrate firm or integrally peeling both the substrate film and the temporary-adhesive layer from the mask-integrated surface protective tape, thereby to expose the mask material layer on top, forming an opening by cutting a portion of the mask material layer corresponding to a street of the semiconductor wafer with a laser;
(c) a plasma-dicing step of segmentalizing the semiconductor wafer at the street with $SF_6$ plasma, and thereby for singulating the semiconductor wafer into semiconductor chips; and
(d) an ashing step of removing the mask material layer with $O_2$ plasma.

Hereinafter, the substrate film, the mask material layer (mask material), and the temporary-adhesive layer are explained in this order.

<Substrate Film>

The substrate film may have a single layer structure, or may be a laminate body in which multiple layers are laminated.

As for the resin or polymer component which constitutes the substrate film, use can be made of any of resins or polymer components to be used in a conventional semiconductor wafer-processing surface protective tape.

Examples thereof include polyolefin resins, polyester resins, (meth)acrylic resins and furthermore polyphenylene sulfide, polyether imide, polyimide, polycarbonate, polyurethane, and rubber. They may be a single substance or a mixture of two or more kinds.

Examples of the polyolefin resins include a polyolefin resin selected from polyethylene, polypropylene, and ethylene/propylene copolymer, each of which is preferable in the present invention.

Meanwhile, polyethylene and polypropylene, other than homo-polyethylene and homo-polypropylene, ordinarily contain α-olefin as a copolymer component in order to adjust its density. In particular, with respect to polyethylene, the content of α-olefin in the polyethylene is generally 5% by mole or less.

The polyethylene is classified into, depending on its density (specific gravity) and the like, a high density polyethylene (HDPE), a low density polyethylene (LDPE), a very low density polyethylene (VLDPE), a linear low density polyethylene (LLDPE) and an ultra-high molecular weight polyethylene (UHMW-PE).

Examples of polypropylene include homo-polypropylene, random-polypropylene, block-polypropylene, and the like.

Examples of the polyethylene resins, other than the above-described ones, include polystyrene or its copolymers, polybutene-1, poly-4-methylpentene-1, ethylene/vinyl acetate copolymer, ethylene/(meth)acrylic acid or/(meth) acrylic acid copolymer; homo-polymer or co-polymer of α-olefin, such as ionomer; a mixture of these polymers, and the like.

Examples of the polyester resin include polyethylene terephthalate (PET), polytrimethylene terephthalate (PTT), polybutylene terephthalate (PBT), polyethylene naphthalate (PEN), and polybutylene naphthalate (PBN).

In the present invention, the substrate film preferably has at least a polyolefin resin layer, and the polyolefin resin is more preferably polyolefin and is still more preferably a low-density polyolefin.

Further, in a case where the substrate film is a laminate body in which plural layers are laminated, one of preferable materials is: a laminate body composed of a low density polyethylene layer and an ethylene/vinyl acetate copolymer layer; a laminate body composed of a polypropylene layer and a polyethylene terephthalate layer; or a laminate body composed of a polyolefin resin layer, a polyethylene terephthalate layer and a polyethylene naphthalate layer.

The foregoing substrate film can be produced using a general extrusion method. In the case where the substrate film is obtained by laminating various resins, these are produced by a co-extrusion method, a lamination method or the like. At this time, as conventionally practiced in the ordinary production method of the laminate film, an adhesion material layer may be provided between resins.

In the present invention, the thickness of the substrate film is preferably from 20 to 200 μm from the viewpoints of strength-elongation characteristics and radiolucency.

<Mask Material Layer>

The mask material layer is a layer that protects a front surface of the semiconductor wafer (patterned surface in particular) from etching (dicing) by irradiation of plasma, such as $SF_6$, in the plasma dicing step, and moreover is a layer that allows a high-precision division of the semiconductor wafer by selectively etching (dicing) only a street portion of the semiconductor wafer which has been removed in the opening step.

In the present invention, since the mask material layer is used in a way such that it is laminated on a patterned surface of the semiconductor wafer, the mask material layer has performances including a temporary-adhesion property as is the case with a temporary-adhesive layer in the ordinary semiconductor wafer-processing surface protective tape.

In the present invention, of the above-described Step (b), in a step of cutting by laser, of the exposed mask material layer on top, a portion of the mask material layer corresponding to the street of the semiconductor wafer, thereby to form an opening of the street of the semiconductor wafer, a laser light is irradiated.

The laser light to be irradiated is not particularly limited, as exemplified by $CO_2$ laser (gas laser of carbon dioxide), YAG laser (solid laser using yttrium, aluminum and garnet), a semiconductor laser, and the like. In the present invention, in particular, a laser having a UV wavelength region of 355 nm which is the third harmonic of YAG laser may be preferably used. Specifically, since this laser has very high absorption ratio for various materials and does not put a thermal stress, this laser can be used for microfabrication requiring high quality. Further, since a beam diameter thereof can be narrowed when compared to a long wave laser, more microscopic processing can be performed, so that this laser can be preferably applied to the present invention.

Therefore, in the present invention, a parallel ray transmittance of the mask material layer at a wavelength region of 355 nm is 30% or less. When the parallel ray absorption ratio is more than 30%, the mask material layer has an insufficient laser light absorption. That is, one of the problems in the opening step of the street portion of the semiconductor wafer is that a laser irradiation needs several times for opening, so that a processing is extended for a long time of period, and another problem is that the mask material layer melts and becomes a residue thereof due to an energy input of the excessive laser light, and as a result, the residue remains on the surface of the semiconductor wafer and degrades a processing quality.

[Resin]

As for the resin that constitutes the mask material layer, any resins may be used. However, it is preferred that a resin which is used as a temporary-adhesive which constitutes a temporary adhesive layer in an ordinary semiconductor wafer processing-surface protective tape.

As for the above-described resin that is used as a temporary-adhesive, a resin composed of (meth)acrylic copolymer is preferred.

Note, in the present invention and the present specification, that the term "(meth)acryl" collectively means "acryl" and "methacryl" and may be either one of "acryl" and "methacryl", or may be a mixture thereof. For example, (meth)acrylic acid ester means acrylic acid ester and/or methacrylic acid ester.

Therefore, in the present invention, it is preferable for the mask material layer, to contain (meth)acrylic copolymer. Meanwhile, the expression "to contain (meth)acrylic copolymer" means to embrace an embodiment in which the (meth)acrylic copolymer is present in the state of being reacted with a curing agent.

The (meth)acrylic copolymer may be a copolymer of two or more kinds of different (meth)acrylic esters, and therefore may be a copolymer of (meth)acrylic ester and a monomer having an ethylenically unsaturated group, which includes (meth)acrylic acid and (meth)acrylic acid amide.

Herein, examples of the monomer having an ethylenically unsaturated group other than the above monomers include (meth)acrylic nitrile, styrene, ethylene, propylene, butylene, butadiene, vinyl alcohol, vinyl acetate, vinyl chloride, maleic acid (esters and acid anhydride are also included), and the like.

In the present invention, as the above-described polymer, it is preferred that a copolymer of two or more kinds of monomers selected from (meth)acrylic acid esters and (meth)acrylic acids. Further, as a polymer that is contained in a resin that constitutes the mask material layer, it may be one kind of copolymer, or a mixture of plural kinds of copolymers.

Although the (meth)acrylic acid ester may be a (meth) acrylic acid alkyl ester or a (meth)acrylic acid aryl ester, and the (meth)acrylic acid alkyl ester is preferable.

Further, the number of carbon atoms in the alcohol moiety (ester forming-alcohol) of the (meth)acrylic acid ester is preferably from 1 to 20, more preferably from 1 to 15, and further preferably from 1 to 12.

Meanwhile, the alcohol moiety of the (meth)acrylic acid ester may have a substituent.

Examples of the (meth)acrylic acid ester include methyl (meth)acrylate, ethyl (meth)acrylate, n-propyl (meth)acrylate, iso-propyl (meth)acrylate, n-butyl (meth)acrylate, t-butyl (meth)acrylate, n-hexyl (meth)acrylate, cyclohexyl (meth)acrylate, n-octyl (meth)acrylate, 2-ethylhexyl (meth) acrylate, decyl (meth)acrylate, dodecyl (meth)acrylate, and 2-hydroxyethyl (meth)acrylate.

A proportion of the (meth)acrylic acid ester component of the total monomer component of the (meth)acrylic copolymer is preferably 70% or more, more preferably 80% or more, and further more preferably 90% or more. Further, in a case where the proportion of the (meth)acrylic acid ester component of the total monomer component of the (meth) acrylic copolymer is not 100% by mole, it is preferable that the remaining monomer component is a monomer component (i.e. (meth)acrylic acid and the like) existing in the form of (meth)acryloyl group polymerized as a polymerizable group.

Further, the proportion of the (meth)acrylic acid ester component having a functional group (for example, hydroxyl group) reacting with a curing agent described below, of the total monomer component of the (meth)acrylic copolymer is preferably 1% by mole or more, more preferably 2% by mole or more, further more preferably 5% by mole or more, and still further more preferably 10% by mole or more. Note that, the proportion of the (meth)acrylic acid ester component having a functional group reacting with the curing agent is preferably 35% by mole or less, more preferably 25% by mole or less.

The mass-average molecular weight of these polymers is normally about 300,000 to 1,000,000.

Herein, the mass-average molecular weight can be measured as a polystyrene conversion molecular weight by Gel Permeation Chromatography (GPC).

The content (content converted to the state before reacting with a curing agent) of the (meth)acrylic copolymer in the mask material layer is preferably 80% by mass or more, more preferably 90% by mass or more, and still more preferably from 95 to 99.9% by mass.

[Curing Agent]

The (meth)acrylic copolymer in the mask material layer is preferably cured and it is preferable for the mask material layer-forming composition, to contain a curing agent in addition to the (meth)acrylic copolymer.

The curing agent is used to adjust an adhesive force and a cohesion force by reacting it with a functional group which the (meth)acrylic copolymer has.

As the curing agent, examples thereof include: an epoxy compound having 2 or more epoxy groups in the molecule (hereinafter, also referred to as "epoxy-based curing agent"), such as 1,3-bis(N,N-diglycidyl aminomethyl)cyclohexane, 1,3-bis(N,N-diglycidyl aminomethyl)toluene, 1,3-bis(N,N-diglycidyl aminomethyl)benzene, N,N,N',N'-tetraglycidyl-m-xylenediamine, ethylene glycol diglycidyl ether, or terephthalic acid diglycidyl ester acrylate; an isocyanate compound having 2 or more isocyanate groups in the molecule (hereinafter, also referred to as "isocyanate-based curing agent"), such as 2,4-tolylenediisocyanate, 2,6-tolylenediisocyanate, 1,3-xylylenediisocyanate, 1,4-xylylenediisocyanate, diphenylmethane-4,4'-isocyanate, hexamethylene diisocyanate, isophorone diisocyanate, or an adduct type of these; an aziridine compound having 2 or more aziridinyl groups in the molecule (aziridine-based curing agent), such as tetramethylol-tri-β-aziridinyl propionate, trimethylol-tri-β-aziridinyl propionate, trimethylolpropane-tri-β-aziridinyl propionate, trimethylolpropane-tri-β-(2-methylaziridine)propionate, tris-2,4,6-(1-aziridinyl)-1,3,5-triazine, tris[1-(2-methyl)-aziridinyl]phosphine oxide, or hexa[1-(2-methyl)-aziridinyl]triphosphatriazine; and the like. An addition amount of the curing agent may be adjusted depending on a desired adhesion force, and is suitably from 0.1 to 5.0 mass parts with respect to 100 mass parts of the (meth)acrylic copolymer. In the mask material layer of the mask-integrated surface protective tape of the present invention, the curing agent is in a state of having reacted with the (meth)acrylic copolymer.

<Radiation-Curable Mask Material Layer>

As the mask material layer, any one of the radiation-curable type mask material layer whose mask material is cured by irradiation of the radiation, or the non-radiation-curable type mask material layer may be workable. In the present invention, in any case of a substrate film or a temporary-adhesive layer provided on the substrate film, since peeling can be easily performed while leaving only a mask material layer on the patterned surface of the semiconductor wafer by making the mask material layer radiation-curable, it is preferable for the mask material layer to be of radiation-curable type.

Herein, the non-radiation-curable type is also called as a pressure-sensitive type as is the case with a temporary-adhesive. This type of the mask material layer is composed of the above-described resin and a resin cured by the curing agent and means not to contain a component having an ethylenically unsaturated group that cures by irradiation of radiation.

In a case of a radiation-curable type mask material layer, in the above-described Step (b), it becomes easy to leave only the mask material layer from the mask-integrated surface protective tape on the semiconductor wafer surface.

Specifically, an interlayer-peeling property between the mask material layer and the layer having contact with this mask material layer (a substrate film, or in a case of the surface protective tape, a temporary-adhesive layer of the surface protective tape) is improved by irradiating a radiation from the side of the substrate film of the mask-integrated surface protective tape thereby to cure the mask material layer, so that the peeling of the surface protective tape from the mask-integrated surface protective tape becomes easy.

This is thought to be caused in a manner such that a mask material layer is 3-dimensionally reticulated by exposure to radiation, so that a temporary-adhesion power is lowered, and thereby a strong adhesion to a layer having contact with the mask material layer, for example, to a temporary-adhesive layer, is released, and as a result, it becomes possible to peel easily from the layer having contact with the mask material layer, for example, the temporary-adhesive layer, of the mask-integrated surface protective tape.

However, it is preferable that the adhesion power between the mask material layer and the substrate film or the temporary-adhesive layer which contact with the mask material layer becomes lower by exposure to radiation than the adhesion power between the mask material layer and a patterned surface of the semiconductor wafer.

In the present invention and the present specification, the term "radiation" is a concept including both a light beam, such as ultraviolet, and an ionizing radiation, such as an electron beam. The radiation for use in the present invention is preferably ultraviolet.

In order to make the mask material layer radiation-curable, the mask material layer should be made to have a property of being cured and 3-dimensionally reticulated by radiation as is the case with a radiation-curable type temporary-adhesive of the ordinarily semiconductor wafer-processing surface protective tape.

In order to make the mask material layer radiation-curable, broadly (1) the mask material layer should contain a resin (polymer) having an ethylenically unsaturated group (radiation-polymerizable carbon-carbon double bond which is also called as an ethylenically double bond) in the side chain, or (2) the mask material layer should contain a low molecular weight compound having at least two ethylenically unsaturated double bonds in the molecule (this compound includes an oligomer and hereinafter, is also called as a radiation-polymerizable low molecular weight compound), together with a resin (polymer) to be used in the above-described pressure-sensitive type.

In the present invention, although any of the above-described methods (1) and (2) is effective, the method (1) is preferable.

Examples of an ethylenically unsaturated group includes: a vinyl group, an allyl group, a styryl group, a (meth)acryloyloxy group, a (meth)acryloylamino group, and the like.

[(1) Resin Having Ethylenically Unsaturated Group in Side Chain]

The resin having an ethylenically unsaturated group in the side chain can be obtained by reacting a copolymer having a reactive functional group ($\alpha$), such as a hydroxyl group, at the side chain, and a compound having a functional group ($\beta$), such as an isocyanate group, that reacts with the reactive functional group ($\alpha$) and further having an ethylenically unsaturated group. Representative examples of the compound having the reactive functional group (β) and the ethylenically unsaturated group include 2-(meth)acryloyloxyethyl isocyanate.

Examples of the above-described functional groups (α) and (β) include a carboxyl group, a hydroxyl group, an amino group, a mercapto group, a cyclic acid anhydride group, an epoxy group, an isocyanate group (—N=C=O) and the like. Herein, the cyclic acid anhydride group is a group having a cyclic acid anhydride structure.

As a combination of the above-described functional groups (α) and (β), for example, in a case of a nucleophilic substitution reaction, one is a nucleophile and another is an electrophile.

The resin having an ethylenically unsaturated group in the side chain is preferably a resin composed of a (meth)acrylic copolymer.

As the (meth)acrylic copolymer, at least in a unit structure obtained from a (meth)acrylic acid ester, a polymer having a unit structure having an ethylenically unsaturated group in the alcohol moiety of the ester is preferable.

Further, it is preferable for the above-described (meth)acrylic copolymer to have, in addition to the unit structure, a recurring unit obtained from a (meth)acrylic acid ester or a (meth)acrylic acid, each of which has no ethylenically unsaturated group in the alcohol moiety thereof, and a monomer having another ethylenically unsaturated group. Of these co-polymers, it is preferable to have a recurring unit obtained from a (meth)acrylic acid ester and/or (meth)acrylic acid.

In particular, it is preferable to have a recurring unit obtained from a (meth)acrylic acid alkyl ester in which the number of carbon atoms in the alcohol moiety thereof is from 8 to 12.

Of the monomer components that constitute the (meth)acrylic copolymer having an ethylenically unsaturated group in the side chain, the ratio of the alkyl (meth)acrylate component having the number of carbon atoms of 8 to 12 is preferably from 45 to 85% by mole, and more preferably from 50 to 80% by mole.

As the resin having an ethylenically unsaturated group in the side chain, those described in paragraphs [0020] to [0036] of Japanese Patent No. 6034522 are preferable. In the present specification, the contents described in said paragraphs [0020] to [0036] are preferably incorporated therein by reference.

[(2) Radiation-Polymerizable Low Molecular Weight Compound]

As for the radiation polymerizable low molecular weight compound described above, use may be widely applicable of: trimethylolpropane triacrylate, tetramethylolmethane tetraacrylate, pentaerythritol triacrylate, pentaerythritol tetraacrylate, dipentaerythritol mono-hydroxypentaacrylate, dipentaerythritol hexaacrylate, 1,4-butyleneglycol diacrylate, 1,6-hexanediol diacrylate, polyethyleneglycol diacrylate, and acrylate-based compounds, such as oligo-ester acrylates, and the like.

Further, in addition to the acrylate-based compounds, use can be also made of a urethane acrylate-based oligomer. The urethane acrylate-based oligomer is obtained by conducting reaction of an acrylate or methacrylate having a hydroxy group (for example, 2-hydroxyethyl acrylate, 2-hydroxyethyl methacrylate, 2-hydroxypropyl acrylate, 2-hydroxypropyl methacrylate, polyethyleneglycol acrylate, polyethyleneglycol methacrylate, and the like) with a urethane prepolymer having an isocyanate group at the end thereof, which is obtained by conducting reaction of a polyol compound, such as a polyester type- or a polyether type-polyol, and a polyvalent isocyanate compound (for example, 2,4-tolylene diisocyanate, 2,6-tolylene diisocyanate, 1,3-xylylene diisocyanate, 1,4-xylylene diisocyanate, diphenyl methane-4,4'-diisocyanate, and the like).

As a blending ratio of the (meth)acrylic copolymer and the radiation-polymerizable low molecular weight compound, the radiation-polymerizable low molecular weight compound is desirably blended in the range of 50 to 200 mass parts and preferably 50 to 150 mass parts, with respect to 100 mass parts of the (meth)acrylic copolymer. When the mixing ratio is in this range, the adhesiveness (or the adhesion power) to the mask material layer after irradiation with radiation can be lowered greatly.

[Photoradical Polymerization Initiator]

In order to subject the mask material layer to polymerization and curing by radiation, the use of a photoradical polymerization initiator allows an effective progress of polymerization reaction, which is preferable.

Examples of the photoradical polymerization initiator include an alkyl phenone type polymerization initiator, a diaryl ketone type polymerization initiator, a diacyl type polymerization initiator, an acyl phosphine oxide type polymerization initiator, an oxime ester type polymerization initiator, a halogenated alkyl-substituted-1,3,5-triazine type polymerization initiator, and 2,4,5-triaryl imidazole dimer (lophine dimer).

In the present invention, it is preferable to use an alkyl- or cycloalkyl-phenone having a hydroxyl group at α-position.

As the photoradical polymerization initiator, for example, use can be made of: isopropylbenzoin ether, isobutylbenzoin ether, benzophenone, Michler's ketone, chlorothioxanthone, benzyl methyl ketal, α-hydroxycyclohexyl phenyl ketone, 2-hydroxymethylphenyl propane, and the like. By adding at least one of these compounds to the mask material layer, a polymerization reaction can be efficiently progressed.

[Curing Agent]

Even in the resin that forms a radiation-curable type mask material layer, it is preferable for this resin to have been cured by a curing agent. In particular, in the case where this resin is a resin having an ethylenically unsaturated group in the side chain, it is preferable to obtain a cured resin by containing the curing agent in a mask material layer-forming composition.

As the curing agent, those exemplified in a case where the curing agent is of pressure-sensitive type are preferable. The content of the curing agent is appropriately from 0.1 to 5.0 parts by mass, with respect to 100 parts by mass of the resin containing the curing agent before curing, for example, (meth)acrylic copolymer. That is, in the mask material layer of the mask-integrated surface protective tape of the present invention, a curing agent is in a state of having reacted with the resin before curing, such as (meth)acrylic copolymer.

[Ultraviolet-Absorbing Constituent]

In the present invention, the parallel ray absorption ratio in the wavelength region of 355 nm of the mask material layer is preferably 30% or less.

In order to adjust the parallel ray absorption ratio in the wavelength region of 355 nm of the mask material layer to 30% or less, it is preferable for the mask material layer to contain an ultraviolet-absorbing constituent.

As the ultraviolet-absorbing constituent, an ultraviolet absorber or an ultraviolet-absorbing polymer is more preferable, to contain in the mask material layer.

(Ultraviolet Absorber)

Since the ultraviolet absorber is excellent in compatibility to the resin, it has a high transparency, and has high absorption performance to a laser light in the ultraviolet region in a small amount thereof, thus it can be preferably used in the present invention.

It is preferable for the mask material layer to contain at least one kind of ultraviolet absorber having a triazine skeleton, a benzophenone skeleton, a benzotriazole skeleton or a benzoate skeleton.

As the ultraviolet absorber, examples of the compound having a triazine skeleton include 2,4-bis[2-hydroxy-4-butoxyphenyl]-6-(2,4-dibutoxyphenyl)-1,3,5-triazine, 2,4-bis (2,4-dimethylphenyl)-6-(2-hydroxy-4-n-octyloxyphenyl)-1, 3,5-triazine, 2-(2,4-dihydroxyphenyl)-4,6-bis(2,4-dimethylphenyl)-1,3,5-triazine, 2-(2,4-dihydroxyphenyl)-4, 6-diphenyl-1,3,5-triazine, and 2-(2-hydroxy-4-methoxyphenyl)-4,6-diphenyl-1,3,5-triazine.

Examples of the compound having a benzophenone skeleton include 2,4-dihyroxybenzophenone, 2,2'-dihydroxy-4, 4'-dimethoxybenzophenone, 2-hydroxy-4-methoxybenzophenone, 2-hydroxy-4-n-octyloxybenzophenone, and 2,2',4, 4'-tetrahydroxybenzophenone.

Examples of the compound having a benzotriazole skeleton include 2-(2-hydroxy-5-t-butylphenyl)-2H-benzotriazole, 2-(2H-benzotriazole-2-yl)-4,6-bis(1-methyl-1-phenylethyl)phenol, and 2-(2H-benzotriazole-2-yl)-6-(1-methyl-1-phenylethyl)-4-(1,1,3,3-tetramethylbutyl)phenol.

Examples of the compound having a benzoate skeleton include 2,4-di-t-butylphenyl-3,5-di-t-butyl-4-hydroxybenzoate, and 2,4-di-t-butylphenyl-4'-hydroxy-3',5'-di-t-butylbenzoate.

As the ultraviolet absorber, use may be made of a commercially available product. Examples thereof include ADEKA STAB LA series (LA-24, LA-29, LA-31, LA-32, LA-36, LA-F70, 1413) (each trade name) manufactured by ADEKA K.K., TINUVIN P, TINUVIN 234, TINUVIN 326, TINUVIN 329, TINUVIN 213, TINUVIN 571, TINUVIN 1577ED, CHIMAS SORB 81, TINUVIN 120 (each trade name) and the like, each of which are manufactured by BASF Corporation.

One kind or a combination of two or more kinds of the ultraviolet absorber may be used.

The addition amount of the ultraviolet absorber may be adjusted according to a desired laser absorption performance. The content of the ultraviolet absorber in the mask material layer is preferably from 0.1 to 5.0 parts by mass, with respect to 100 parts by mass of the resin, i.e. (meth) acrylic copolymer.

(Ultraviolet-Absorbing Polymer)

In order for the mask material layer to have high laser absorptivity, it is preferable for the mask material layer to contain an ultraviolet-absorbing polymer. With any of the ultraviolet-absorbing polymers, an ultraviolet-absorbing performance is given to the polymer itself, by using a polymerizable monomer having an ultraviolet-absorbing group for one of repeating units (segments) obtained from a copolymerizable monomer that constitute the polymer molecule. The above-described ultraviolet-absorbing polymer has no problem, such as elution or bleed-out of the ultraviolet-absorbing constituent, as compared to a structure in which an ultraviolet absorber has been kneaded with and blended into a general-purpose polymer.

As the ultraviolet-absorbing polymer, those having an ultraviolet-absorbing skeleton in the side chain are preferred.

Examples of the ultraviolet-absorbing skeleton include those exemplified in the ultraviolet absorber. In the present invention, a benzotriazole skeleton, a benzophenone skeleton, or a triazine skeleton is preferable.

The ultraviolet-absorbing polymer having an ultraviolet-absorbing skeleton in the side chain is obtained by polymerizing a monomer having any of these skeletons, for example, at least one (meth)acrylic monomer selected from the (meth)acrylate compounds having any of these skeleton in the alcohol moiety thereof.

Therefore, in the present invention, the ultraviolet-absorbing polymer is preferably a (meth)acrylic polymer having an ultraviolet-absorbing skeleton selected from at least any one of a benzotriazole skeleton, a benzophenone skeleton and a triazine skeleton in the side chain thereof.

The ultraviolet-absorbing polymer is obtained by polymerizing a (meth)acrylic acid ester compound (monomer) having an ultraviolet-absorbing skeleton in an alcohol moiety of the (meth)acrylic acid ester compound. In polymerizing, such an ultraviolet-absorbing monomer, use may be made of one kind or a combination of two or more kinds of the ultraviolet-absorbing monomer.

Preferable compounds as an ultraviolet-absorbing monomer are represented by any of the following formulae (I) to (VII).

Formura (I)

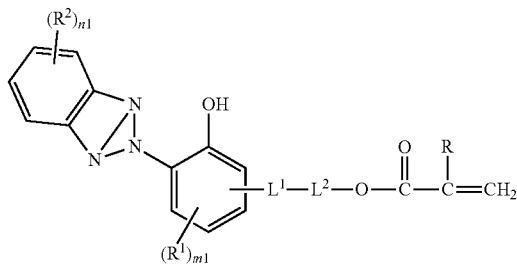

Formura (II)

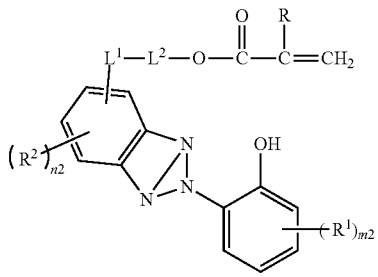

Formura (III)

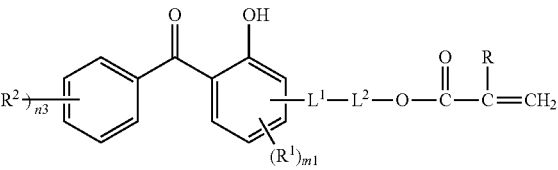

Formura (IV)

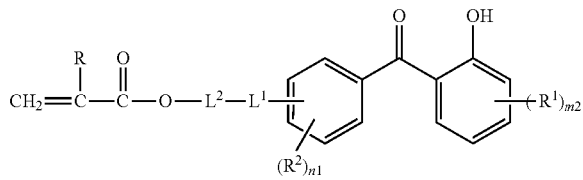

Formura (V)

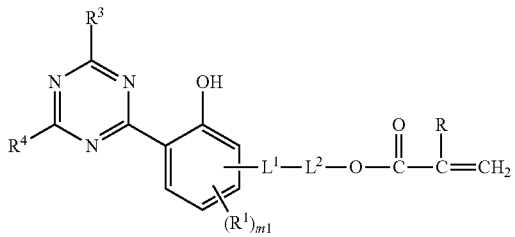

Formura (VI)

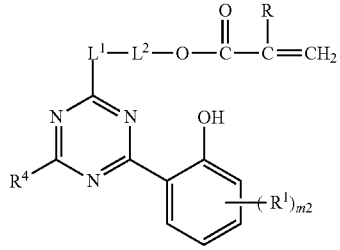

Formura (VII)

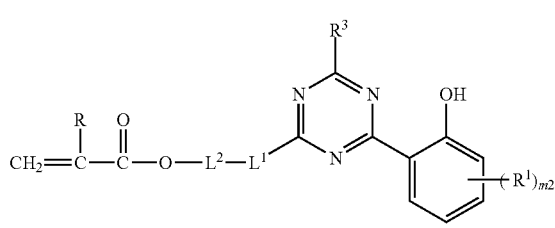

In formulas, R designates a hydrogen atom or a methyl group, and $R^1$ to $R^4$ each independently designate a substituent. m1 is an integer of 0 to 3, m2 is an integer of 0 to 4, n1 is an integer of 0 to 4, n2 is an integer of 0 to 3, and n3 is an integer of 0 to 5. $L^1$ designates a single bond or a divalent linking group, and $L^2$ designates an alkylene group.

Herein, the amino group includes $—NH_2$, an alkyl amino group, an aryl amino group, and a heterocyclic amino group.

Examples of the substituent for $R^1$ to $R^4$ include a halogen atom, an alkyl group, a cycloalkyl group, an aryl group, a heterocyclic group, an alkoxy group, an aryloxy group, a heterocyclic oxy group, an alkylthio group, an arylthio group, a heterocyclic thio group, a hydroxyl group, a mercapto group, an amino group, an acyl group, an acylamino group, a sulfonamide group, a carbamoyl group, a sulfinamoyl group, an acyloxy group, an alkoxycarbonyl group, an aryloxycarbonyl group, a sulfonyl group, a carboxy group, a sulfo group, and a nitro group.

$R^3$ and $R^4$ each are preferably an alkyl group, an aryl group, an alkoxy group, an aryloxy group or an amino group.

The divalent linking group for $L^1$ designates —O—, —S—, —$SO_2$—, —N(Ra)—, —C(=O)—, an alkylene group, an arylene group, a divalent heterocyclic group, and a combination of these groups. Herein, Ra designates a hydrogen atom or a substituent.

Herein, examples of the combination of these groups include —C(=O)—O—, —O—C(=O)—, —N(Ra)—C(=O)—, —C(=O)—N(Ra)—, -alkylene-O—, —O-alkylene-O—, -alkylene-S—, -alkylene-N(Ra)—, -arylene-O—, —O-arylene-O—, -arylene-S—, and -arylene-N(Ra)—.

The number of carbon atoms of the alkylene group for $L^2$ is preferably 1 to 20, more preferably 2 to 18, and further preferably 2 to 8. Examples thereof include methylene, ethylene, propylene, trimethylene, butylene, hexylene, and octylene.

Meanwhile, preferable compounds of any of the ultraviolet absorbers can be represented by any of the same formulas as any of the above-described formulas (I) to (VII) from each of which -$L^1$-$L^2$-O—C(=O)—C(R)=$CH_2$ is eliminated.

Examples of these ultraviolet-absorbing monomers include 2-[3-(2H-1,2,3-benzotriazole-2-yl)-4-hydroxyphenyl]ethyl methacrylate, 2-[2-(2-hydroxy-4-octyloxyphenyl)-2H-1,2,3-benzotriazole-5-yl-oxy]ethyl methacrylate, 2-[2-hydroxy-5-(methacryloyloxymethyl)phenyl]-2H-benzotriazole, 2-(4,6-dipheny-1,3,5-triazine-2-yl)-5-[2-(acryloyloxy)ethoxy]phenol, 2-(4,6-dipheny-1,3,5-triazine-2-yl)-5-[2-(methacryloyloxy)ethoxy]phenol, and the like.

Other monomer constituents that can be copolymerized with the above-described ultraviolet-absorbing monomers are not particularly limited and may be adequately selected and used.

Examples thereof include (meth)acrylic acid alkyl esters, such as methyl (meth)acrylate, ethyl (meth)acrylate, propyl (meth)acrylate, isopropyl (meth)acrylate, butyl (meth)acrylate, isobutyl (meth)acrylate, t-butyl (meth)acrylate, 2-ethylhexyl (meth)acrylate, octyl (meth)acrylate, nonyl (meth)acrylate, lauryl (meth)acrylate, and stearyl (meth)acrylate.

Further, examples thereof include hydroxyl group-containing unsaturated monomers, such as hydroxyethyl (meth)acrylate, hydroxypropylethtyl (meth)acrylate, and hydroxybutyl (meth)acrylate.

The proportion of the ultraviolet-absorbing monomer constituent of the total monomer constituents that constitute the ultraviolet-absorbing polymer is preferably 50% by mass or more.

The mass average molecular weight of the ultraviolet-absorbing polymer is preferably from about 10,000 to about 200,000.

As the ultraviolet-absorbing polymer, use may be made of a commercially available product. Examples thereof include VANARESIN UVA-5080, VANARESIN UVA-5080 (OHV20), VANARESIN UVA-7075, VANARESIN UVA-7075 (OHV20), VANARESIN UVA-55T, VANARESIN UVA-55MHB, VANARESIN UVA-73T, NEWCOAT UVA-101, NEWCOAT UVA-102, NEWCOAT UVA-103 and NEWCOAT UVA-104 (each trade name, manufactured by Shin-Nakamura Chemical Co., Ltd.).

In the present invention, the ultraviolet-absorbing polymer may be used as a base resin without any other base resins. In other words, the ultraviolet-absorbing polymer may be used alone as a resin that constitutes the mask material layer.

Note, in the present invention, that a resin itself having an ethylenycally unsaturated group in the side chain may have an ultraviolet-absorbing skeleton in the side chain.

Herein, when added and to be used to the base resin, for example, a (meth)acrylic copolymer, the content of the ultraviolet-absorbing polymer may be adjusted according to a desired laser absorption performance and the content thereof is appropriately from 5.0 to 50.0 parts by mass with respect to 100 parts by mass of the base resin, for example, a (meth)acrylic copolymer.

The thickness of the mask material layer is preferably from 5 to 100 μm and more preferably from 5 to 40 μm, from the viewpoint of removal speed in plasma ashing.

<Temporary-Adhesive Layer>

The mask-integrated surface protective tape of the present invention has at least a substrate film and a mask material layer, and the mask material layer is provided directly on the substrate film or provided on the substrate film through a temporary-adhesive layer.

In the present invention, the mask material layer is preferably provided on the substrate film through a temporary-adhesive layer. In other words, the mask material layer is arranged above the temporary-adhesive layer of the surface protective tape.

The temporary-adhesive layer takes a role in protection of the patterned surface together with a mask material layer by covering an asperity (or an unevenness) of the device formed on the patterned surface to enhance adhesion property to the patterned surface. In order to make the mask-integrated surface protective tape withstand a load of the wafer-thinning step, it is preferable that the adhesion property of the temporary-adhesive layer to a mask material layer or a substrate film in the wafer-thinning step is high. On the other hand, after the wafer-thinning step, because the temporary-adhesive layer is integrally peeled with the substrate film 3aa from the mask material layer, it is preferable that the adhesion property of the temporary-adhesive layer to the mask material layer is low (high peeling property is preferable).

As for the temporary-adhesive that constitutes the temporary-adhesive layer, use may be made of: temporary-adhesives that can be used in a conventional surface protective tape for processing a semiconductor wafer.

The temporary-adhesive may be a radiation-curable type temporary-adhesive or a pressure-sensitive type temporary-adhesive. In a case where the mask material layer is a radiation-curable type, a pressure-sensitive type temporary-adhesive is preferred, while in a case where the mask material layer is a pressure-sensitive type, a radiation-curable type temporary-adhesive is preferred.

Therefore, in the present invention, because it is preferable for the mask material layer to be a radiation-curable type, a pressure-sensitive type temporary-adhesive is preferred.

The description of the mask material layer is applied to the temporary-adhesive without any change, except for the parallel ray transmittance in the wave length region of 355 nm of the mask material layer being 30% or less and the use of the ultraviolet-absorbing constituent to be used for this purpose.

However, in the present invention, an ultraviolet-absorbing constituent may be contained in the temporary-adhesive layer. In this case, the content of the ultraviolet-absorbing constituent in the temporary-adhesive layer is preferably an amount to be more than 30% in terms of parallel ray absorption rate in the wavelength region of 355 nm, and it is more preferable for the temporary-adhesive layer not to contain the ultraviolet-absorbing constituent.

The thickness of the temporary-adhesive layer is preferably from 5 to 100 μm from the viewpoints of more increasing protective ability of the device or the like formed on the patterned surface thereof, and more increasing adhesion to the patterned surface of the semiconductor wafer. Meanwhile, depending on the type of devices, since the asperity of the patterned surface of the semiconductor wafer is roughly from about several micro-meters to about 15 μm, the thickness of the temporary-adhesive layer is more preferably from 5 to 30 μm.

Further, depending on the type of devices, the thickness of the temporary-adhesive layer is preferably equal to or more than that of the mask material layer and it is more preferable that the temporary-adhesive layer is thicker than the mask material layer.

Figure 1B:
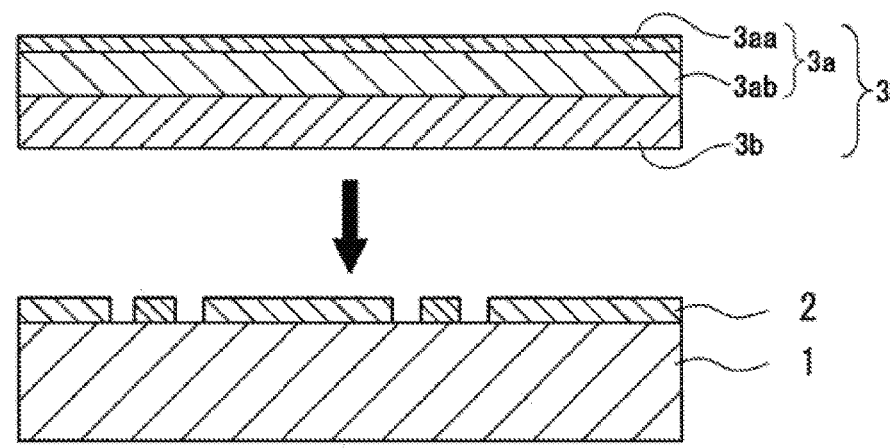
Figure 1B:
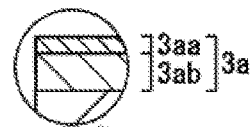
Figure 1C:
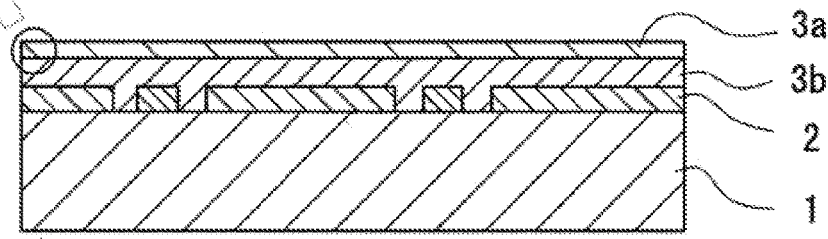

Of the mask-integrated surface protective tape of the present invention, the mask-integrated surface protective tape having a temporary-adhesive layer has a constitution as shown in fragmentary FIGS. 1(b) and 1(c).

In the fragmentary FIGS. 1(b) and 1(c), a mask-integrated surface protective tape 3 has a temporary-adhesive layer 3ab on a substrate film 3aa, and further has a mask material layer 3b on the temporary-adhesive layer 3ab.

Herein, a tape composed of the substrate film 3aa and the temporary-adhesive layer 3ab is a surface protective tape 3a.

Note, in the fragmentary FIGS. 1(b) and 1(c), that in a case where the mask-integrated surface protective tape 3 does not have any temporary-adhesive layer 3ab, a part of the surface protective tape 3a acts as a substrate film 3a.

In the present invention, the mask material layer and the temporary-adhesive layer may contain constituents other than a resin, a curing agent and a photoradical polymerization initiator, each of which is to be used in a conventional surface protective tape for processing a semiconductor wafer.

<<Method of Producing a Semiconductor Wafer>>

In the present invention, a semiconductor wafer is preferably produced, particularly, through the following Steps, including Steps (a) to (d).

[Steps]
(a) A step of, in the state of having laminated the mask-integrated surface protective tape on the side of a patterned surface of a semiconductor wafer, grinding the backing-face of the semiconductor wafer; laminating a wafer-fixing tape on the backing-face side of the ground semiconductor wafer; and supporting and fixing the wafer to a ring frame;
(b) A step of, after peeling the substrate firm or integrally peeling both the substrate film and the temporary-adhesive layer from the mask-integrated surface protective tape, thereby to expose the mask material layer on top, forming an opening by cutting a portion of the mask material layer corresponding to a street of the semiconductor wafer with a laser;
(c) A plasma-dicing step of segmentalizing the semiconductor wafer at the street with $SF_6$ plasma, and thereby for singulating the semiconductor wafer into semiconductor chips; and
(d) An ashing step of removing the mask material layer with $O_2$ plasma.

In the method of producing a semiconductor wafer according to the present invention, the use of the mask-integrated surface protective tape of the present invention may allow the production of the semiconductor wafer, through steps including the above-described Steps (a) to (d).

In the method of producing a semiconductor chip applied to the mask-integrated surface protective tape of the present invention, the following Step (e), after the Step (d), is preferably included. When the production method includes the following Step (e), the following Step (f) is preferably included after the Step (e):

(e) A step of picking up the semiconductor chip from the wafer-fixing tape; and
(f) A step of transiting the picked-up semiconductor chip to a die bonding step.

Regarding the production method of the semiconductor chip using the mask-integrated surface protective tape of the present invention (hereinafter, referred to simply as "a production method applied to the present invention"), a preferable embodiment thereof is described below with reference to drawings. However, the present invention is not limited to the following embodiments, except for those specified in the present invention. Further, the form shown in each drawing is a schematic view for facilitating the understanding of the present invention. Therefore, regarding the size, the thickness, the relative magnitude relationship and the like of each component, the large one or the small one is sometimes changed for the purpose of illustration, and the form does not show a real relation as it is. Further, the present invention is not limited to outer forms and shapes shown in these figures, except for the requirements defined by the present invention.

Preferable embodiments of the production method applied to the present invention may be classified into first and second embodiments, as described below.

Note that, as the apparatus, the materials and the like to be used in the following embodiments, use may be made of: an ordinary apparatus, materials and the like which have been conventionally used in the processing of the semiconductor wafer, unless otherwise specified. The conditions of use for those can be appropriately set and optimized in accordance with the intended use within a range of an ordinary method for using. Further, omitted are duplicated descriptions about the materials, structures, methods, effects, and the like, which are common to each embodiment.

First Embodiment [FIG. 1(a) to FIG. 5(b)]

The first embodiment of a production method applied to the present invention is described with reference to FIG. 1(a) to FIG. 5(b).

Note that since these figures are schematic views showing a layer structure as described above, these do not reflect realistically the thickness of each of the substrate film, the temporary-adhesive layer, and the mask material layer. Explanation of the already-described mask-integrated surface protective tape is applied to the substrate film and the thickness of each layer.

A semiconductor wafer 1 has a patterned face 2 on the surface S of which a circuit or the like of the semiconductor device is formed (see FIG. 1(a)). On this patterned surface 2, a mask-integrated surface protective tape 3 in which a mask material layer 3b has been further provided on a temporary-adhesive layer 3ab of a surface protective tape 3a in which the temporary-adhesive layer 3ab has been provided on a substrate film 3aa, is laminated (see FIG. 1(b)), whereby a semiconductor wafer 1 whose patterned surface 2 is covered with the mask-integrated surface protective tape 3 is obtained (see FIG. 1(c)).

Herein, the fragmentary FIGS. 1(b) and 1(c) show the surface protective tape 3a having on the substrate film through the temporary-adhesive layer. In this case, the surface protective tape 3a is composed of the substrate film 3aa and the temporary-adhesive layer 3ab.

In the present invention, a mask-integrated surface protective tape 3 having the mask material layer provided directly on the substrate film is also included in the substrate film provided directly on the temporary-adhesive layer. In this tape, since the mask-integrated surface protective tape does not have any temporary-adhesive layer directly on the substrate film, 3a in the fragmentary FIGS. 1(b) and 1(c) indicates a substrate film. Therefore, in the following explanation, with respect to the mask material layer directly on the substrate film, the expressions "surface protective tape 3a" and "surface protective tape" should be read as "substrate film 3a" and "substrate protective tape", respectively.

Figure 2A:
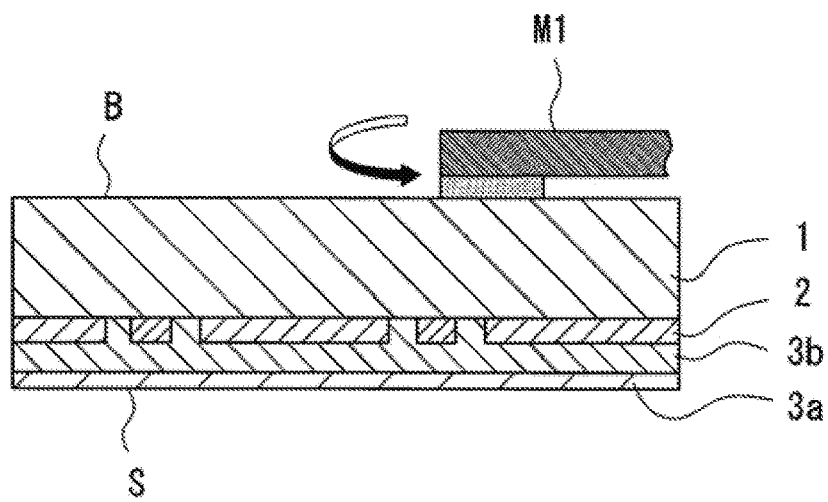
FIGS. 2(a) to 2(c) are schematic cross-sectional views illustrating steps of production of semiconductor chips to thinning and fixing of the semiconductor wafer in the first embodiment using the mask-integrated surface protective tape of the present invention. In those views, fragmentary
Figure 2B:
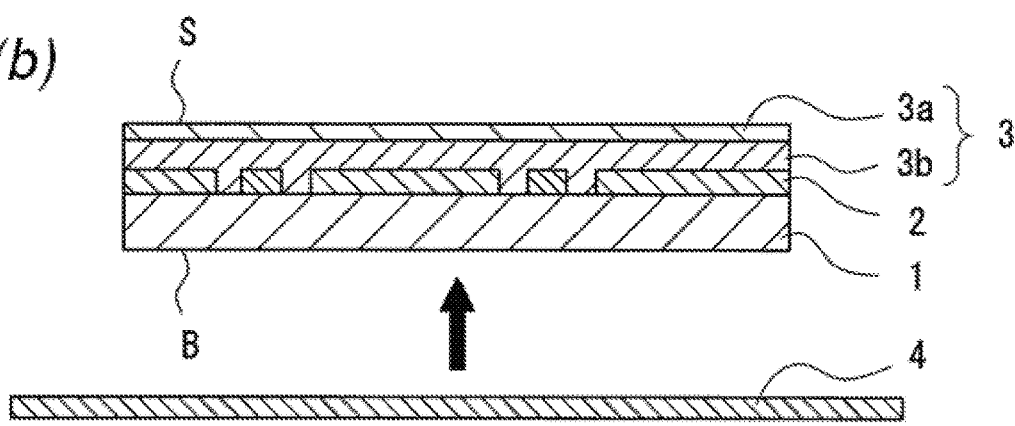

Then, the backing-face B of the semiconductor wafer 1 is ground by a wafer-grinding apparatus M1, to thin a thickness of the semiconductor wafer 1 (see FIG. 2(a)). On the ground backing-face B, a wafer-fixing tape 4 is laminated (see FIG. 2(b)), to support and fix the wafer to a ring frame F (see FIG. 2(c)).

Figure 3A:
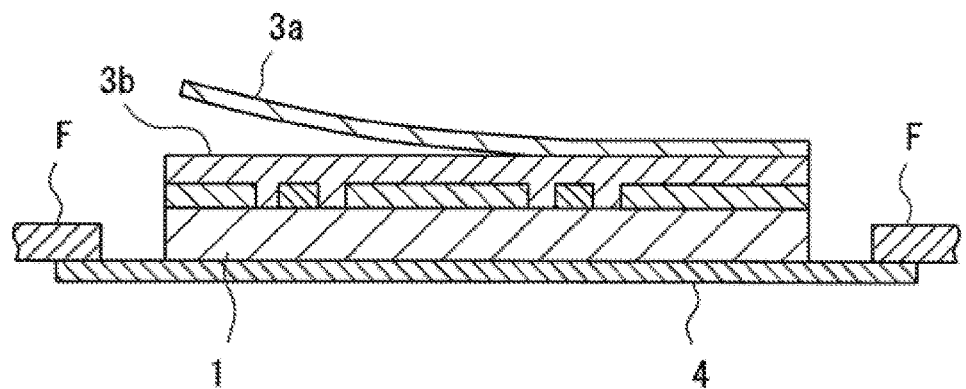
FIGS. 3(a) to 3(c) are schematic cross-sectional views illustrating steps of production of semiconductor chips to the mask formation in the first embodiment using the mask-integrated surface protective tape of the present invention. In those views, fragmentary
Figure 3B:
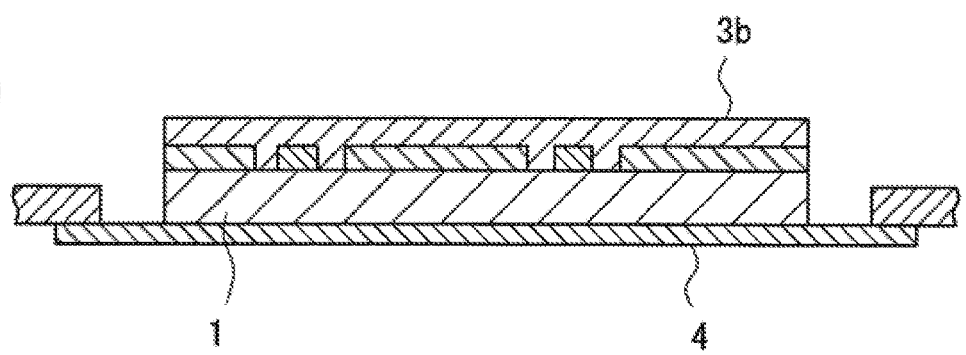
Figure 3C:
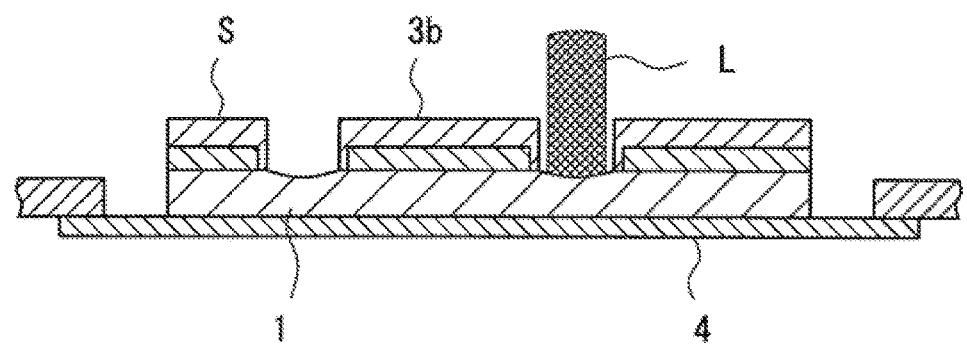

The surface protective tape 3a of the mask-integrated surface protective tape 3 is peeled off from the semiconductor wafer 1, while leaving the mask material layer 3b on the semiconductor wafer 1 (see FIG. 3(a)), so that the mask material layer 3b is exposed (uncovered) (see FIG. 3(b)). Further, laser L is irradiated from the surface S side toward a plurality of streets (not shown) appropriately formed in a grid pattern or the like onto the patterned face 2, thereby to remove a portion corresponding to a street of the mask material layer 3b, so that streets of the semiconductor wafer are opened (see FIG. 3(c)).

For the laser irradiation with which the mask material layer 3b is cut, use can be made of a laser irradiator for irradiating an ultraviolet or infrared laser light. In this laser irradiator, a laser irradiation part capable of freely moving along the street of the semiconductor wafer 1 is arranged, so that the laser can be irradiated, with the laser having an output controlled appropriately for removing the mask material layer 3b.

Meanwhile, the laser is not particularly limited to $CO_2$ and YAG lasers. However, in particular, a laser having a UV wavelength region of 355 nm which is the third harmonic of YAG laser may be preferably used in the present invention. Specifically, since this laser has very high absorption rate for various materials and does not put a thermal stress, this laser can be used for microfabrication requiring high quality. Further, since a beam diameter thereof can be narrowed when compared to a long wave laser, more microscopic processing can be performed, so that this laser can be preferably applied to the present invention.

Figure 4A:
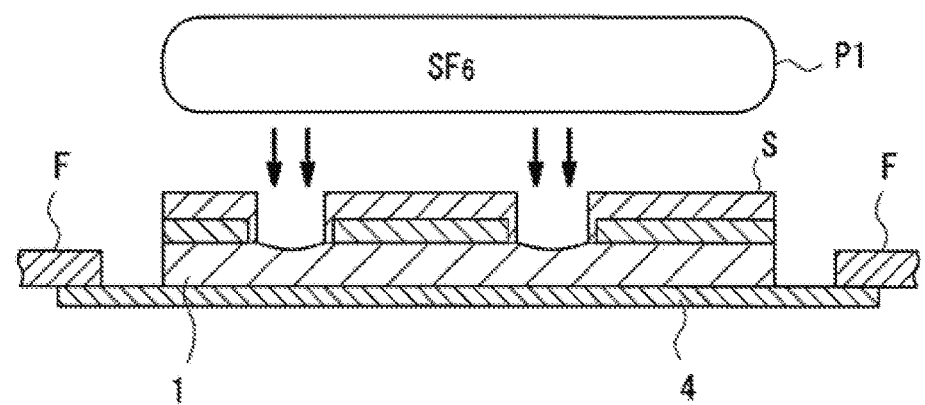
FIGS. 4(a) to 4(c) are schematic cross-sectional views illustrating the plasma dicing and plasma ashing steps in the first embodiment using the mask-integrated surface protective tape of the present invention. In those views, fragmentary
Figure 4B:
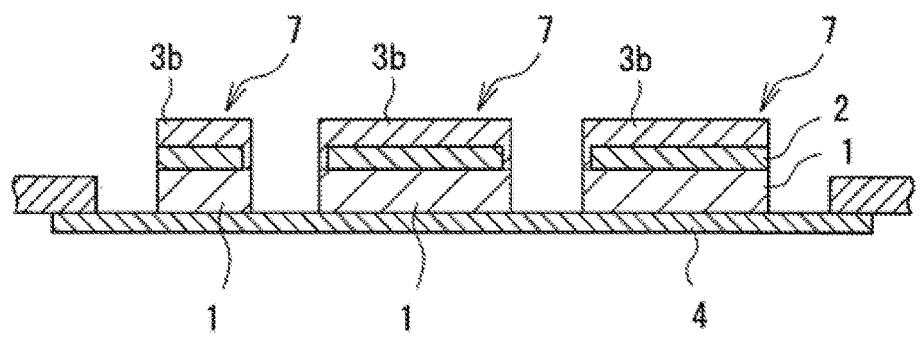
Figure 4C:
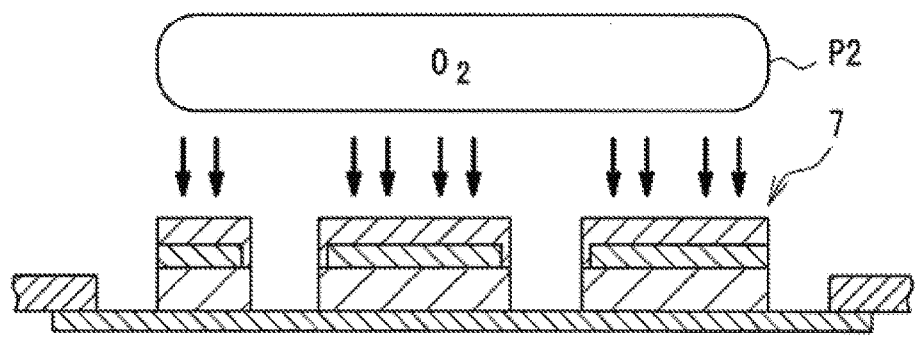
Figure 5A:
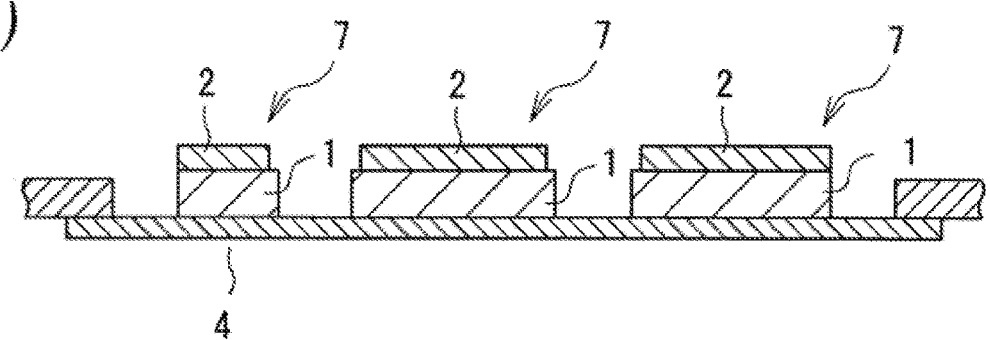
FIGS. 5(a) and 5(b) are schematic cross-sectional views illustrating steps of production of semiconductor chips to picking up a chip in the first embodiment using the mask-integrated surface protective tape of the present invention. In those views, fragmentary
Figure 5B:
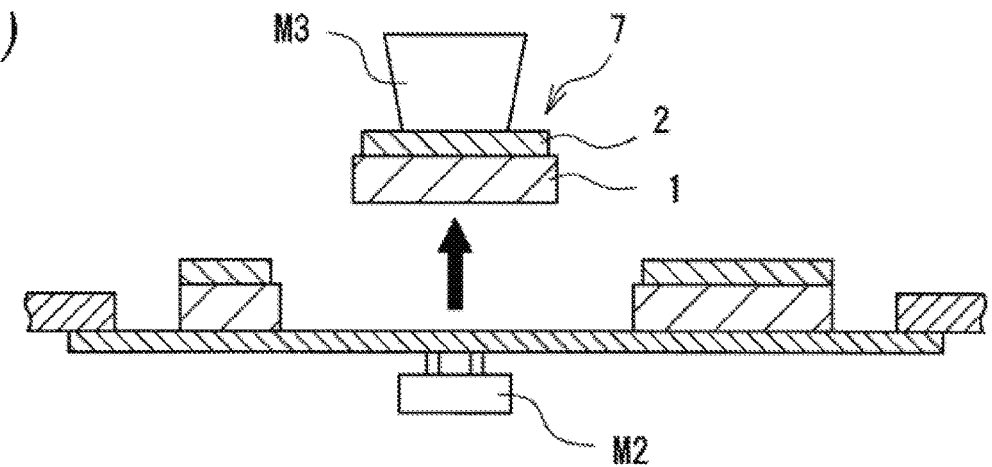

Then, a treatment with the plasma P1 of $SF_6$ gas is carried out from the surface S side, thereby to etch the semiconductor wafer 1 which is exposed at the street portion (see FIG. 4(a)), and the semiconductor wafer is divided into individual chips 7, which results in singulation (see FIG. 4(b)). After that, ashing with the plasma P2 of $O_2$ gas is carried out (see FIG. 4(c)), thereby to remove the mask material layer 3b remaining on the surface S (see FIG. 5(a)). Then, at last, the singulated chip 7 is knocked up by a pin M2, and is picked up by adsorption with a collet M3 (see FIG. 5(b)).

Herein, a process of etching of Si of the semiconductor wafer with the use of $SF_6$ gas is also called as a BOSCH process. This process allows a reaction of the exposed Si and a F (fluorine) atom formed from a plasmarized $SF_6$, thereby to remove the exposed Si as silicon tetrafluoride ($SiF_4$), which is also called as reactive ion etching (RIE). On the other hand, the removal with the $O_2$ plasma is a method which is also used as plasma cleaner in the course of a semiconductor production process, and is also called as ashing (ash-making), which is one of means for removal of the organic substance. This method is carried out, in order to clean an organic substance deposit (residue) remaining on a semiconductor device surface.

Then, the materials to be used in the method described above are described. Note that the materials described below are those which can be used in all of the mask-integrated surface protective tape of the present invention and therefore are not limited to the case of using the mask-integrated surface protective tape of the present invention in the above described method.

The semiconductor wafer 1 is a silicon wafer, on its one side, having the patterned face 2 on which the circuit or the like of the semiconductor device is formed. The patterned face 2 is a face on which the circuit or the like of the semiconductor device is formed, which has a street in a planar view.

The wafer-fixing tape 4 is required to hold the semiconductor wafer 1 and to have resistance to plasma which is sustainable even if the wafer-fixing tape is subjected to the plasma dicing step. Further, in the picking-up step, a good picking-up property and also an expansion property and the like in some cases are required. As the foregoing wafer-fixing tape 4, a tape similar to the surface protective tape 3a may be used. Further, use may be made of any of known dicing tapes to be used in a conventional plasma dicing method, which are generally called as a dicing tape. Further, the use can be also made of a dicing die-bonding tape, in which an adhesive for die-bonding is laminated between the temporary-adhesive layer and the substrate film, in order to make it easy to transit to the dicing die-bonding step after picking-up.

In order to carry out the plasma dicing and the plasma ashing, use can be made of a plasma-etching apparatus. The plasma-etching apparatus is an apparatus, which is capable of subjecting the semiconductor wafer 1 to dry etching, and in which a sealed treatment space is made in a vacuum chamber, to place the semiconductor wafer 1 on the side of the electrode for a high-frequency wave. A gas for plasma generation is supplied from the side of a gas-supplying electrode provided facing the electrode for high-frequency wave. If a high-frequency voltage is applied to the electrode for a high-frequency wave, plasma is generated between the gas-supplying electrode and the electrode for a high-frequency wave. Therefore, the resultant plasma is used. By circulating a refrigerant in a heat-producing electrode for high-frequency wave, it is possible to prevent a temperature elevation of the semiconductor wafer 1 due to the heat of this plasma.

In accordance with the method of producing the semiconductor chip (the method of processing the semiconductor wafer), any photolithographic step or the like becomes unnecessary, which is provided with a resist to be used in the conventional plasma dicing process, by giving a mask function in the plasma dicing to the surface protective tape (substrate film) protecting the patterned face. In particular, by using the surface protective tape, a technique becomes unnecessary, in which a high level of alignment, such as printing and transferring, is required for the mask formation. Therefore the mask-integrated surface protective tape of the present invention can be easily laminated on the semiconductor wafer surface, and a mask can be easily formed by the laser equipment.

Further, the mask material layer 3b can be removed with $O_2$ plasma, and therefore removal of the mask portion can be carried out by the same apparatus as the plasma dicing apparatus. In addition, the plasma dicing is carried out from the patterned face 2 side (surface S side), and therefore it is not necessary to turn the chip upside down before the picking-up operation. From these reasons, the facilities can be simplified, and process costs can be considerably suppressed.

Figure 6A:
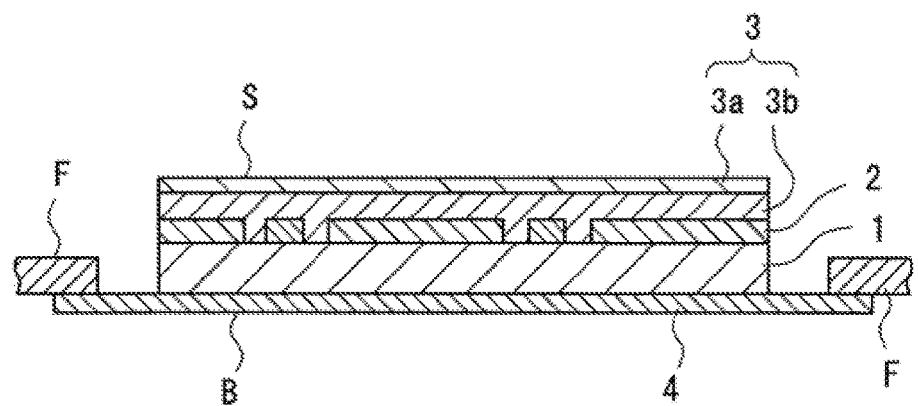
FIGS. 6(a) to 6(c) are schematic cross-sectional views illustrating a state before and after a treatment with an ultraviolet irradiation carrying out in the second embodiment using the mask-integrated surface protective tape of the present invention. In those views, fragmentary
Figure 6B:
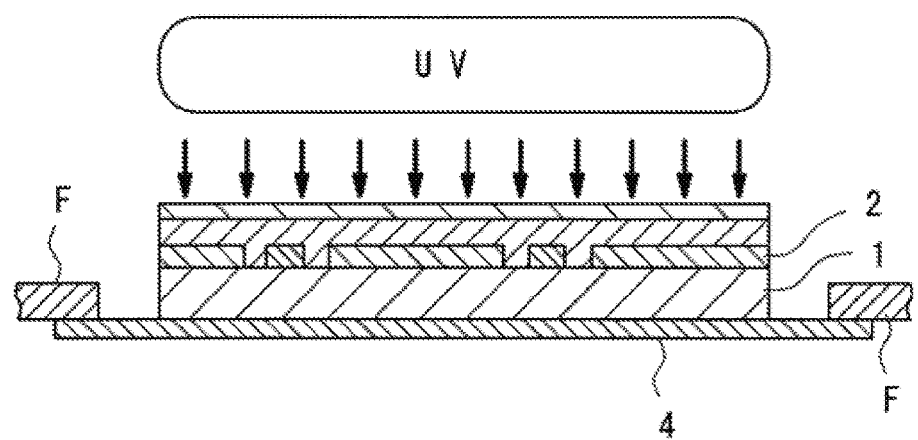
Figure 6C:
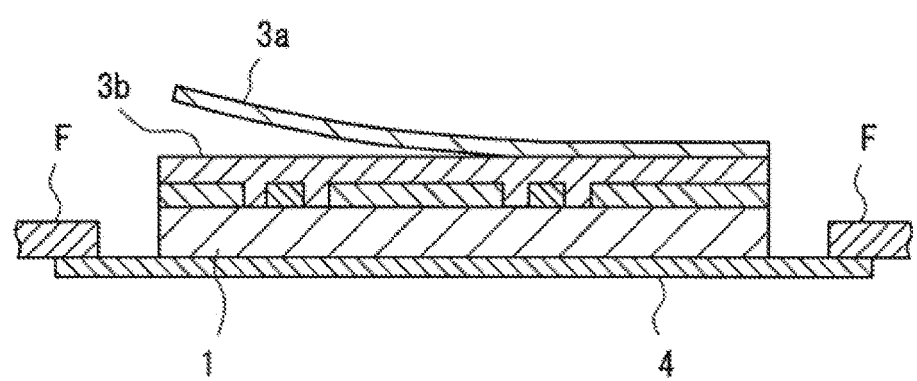

Second Embodiment [FIG. 6(a) to 6(c)]

This embodiment is different from the first embodiment in the point that the second embodiment contains a step of curing the mask material layer and the temporary-adhesive layer by irradiating the mask-integrated surface protective tape 3 with a radiation, such as an ultraviolet light or the like, prior to the step of peeling-off the surface protective tape 3a in the first embodiment. Other steps are the same as in the first embodiment.

Note, in the present invention, that not the temporary-adhesive layer, but the mask material layer is preferably cured.

Figure 2C:
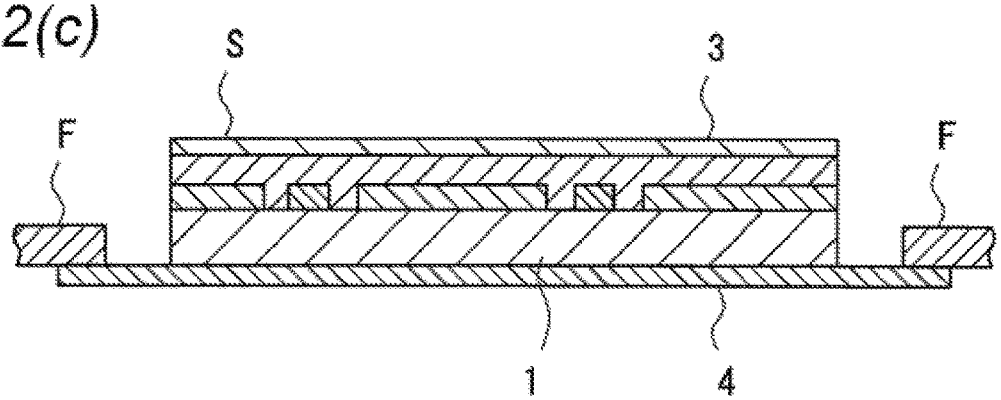

Specifically, after laminating the mask-integrated surface protective tape 3 on the surface S side of the semiconductor wafer 1, and laminating the wafer-fixing tape 4 on the ground backing-face B side of the semiconductor wafer 1, and supporting and fixing it to the ring frame F (see FIG. 2(c), FIG. 6(a)), ultraviolet UV is irradiated from the surface S side toward the mask-integrated surface protective tape 3 (see FIG. 6(b)). Then, after curing the mask material layer 3b of the mask-integrated surface protective tape 3, the surface protective tape 3a is removed (see FIG. 6(c)), whereby the mask material layer 3b is uncovered. Then, this step is transited to a step of cutting, with a laser L, a portion of the mask material layer 3b corresponding to the street.

Meanwhile, the ultraviolet irradiation is performed by irradiating an ultraviolet light entirely to the mask-integrated surface protective tape from the substrate film side so that the integrated irradiation would be 500 mJ/cm². A high-pressure mercury lamp is preferably used for the ultraviolet irradiation.

In the mask-integrated surface protective tape that can be used in this embodiment, at variation with the mask-integrated surface protective tape 3 described in the first embodiment, use is made of a material which is capable of being cured with a radiation, such as an ultraviolet ray or the like, in the mask material layer 3b.

By curing the mask material layer 3b with the ultraviolet light or the like, peeling-off of the surface protective tape 3a from mask material layer 3b is made easily performed.

Each of the above-described embodiments is an example of the present invention and therefore the present invention is not limited to these embodiments. Accordingly, addition, deletion, modification and the like of a known process may be made in each process to the extent of no departure from the scope of the present invention.

EXAMPLES

The present invention will be described in more detail based on examples given below, but the invention is not meant to be limited by these.

Example 1

<Production of a Mask-Integrated Surface Protective Tape>
An (meth)acrylic copolymer (mass-average molecular weight: 400,000, hydroxyl value: 0 mg-KOH/g, acid value: 48.8 mg-KOH/g, Tg: −23° C.) was synthesized by mixing 20 mol % of acrylic acid, 70 mol % of butyl acrylate and 10 mol % of methyl acrylate and was subjecting to polymerization in ethyl acetate solution.

To this (meth)acrylic copolymer solution, 2.0 parts by mass of TETRAD-X (manufactured by Mitsubishi Gas Chemical Company, Inc., epoxy-based curing agent) as a curing agent, was blended, with respect to 100 parts by mass of the copolymer, to obtain a temporary-adhesive composition A.

Were mixed 1 mol % of methacrylic acid, 78 mol % of 2-ethylhexyl acrylate and 21 mol % of 2-hydroxyethyl acrylate. The mixture was subjected to polymerization in an ethyl acetate solution, to obtain a solution of (meth)acrylic copolymer having a mass-average molecular weight of 700,000.

To the obtained copolymer, 2-methaclyroyloxyethyl isocyanate (trade name: KARENZ MOI, manufactured by Showa Denko K.K.) was adjoined, to obtain a (meth)acrylic copolymer containing an ethylenically unsaturated group (mass-average molecular weight: 700,000, double bond amount: 0.90 meq/g, hydroxyl group value: 33.5 mg-KOH/g, acid value: 5.5 mg-KOH/g, Tg: −68° C.).

To 100 mass parts of this ethylenically unsaturated group-containing (meth)acrylic copolymer, 1.0 mass part of COLONATE L (isocyanate-based curing agent, manufactured by Nippon Polyurethane Industry Co., Ltd.) as a curing agent, 2.0 mass parts of IRGACURE 184 (manufactured by BASF) as a photopolymerization initiator, and 0.75 mass parts of LA-F70 (ultraviolet absorber of triazine skeleton, manufactured by ADEKA K.K.) as a ultraviolet absorber, were blended, to obtain a mask material layer-forming composition B.

The above-described temporary-adhesive composition A was coated on a peeling liner so that a thickness after drying would be 30 μm, and the formed temporary-adhesive layer 3ab was laminated on a substrate film 3aa of a 100 μm-thick low density polyethylene (LDPE) film, to obtain a surface protective tape 3a having a thickness of 130 μm.

Further, the mask material layer-forming composition B was coated on a peeling liner so that the thickness after drying would be 10 μm, to form a mask material layer 3b, and then laminated the thus-formed mask material layer 3b on the surface of the temporary-adhesive layer exposed by peeling the peeling liner of the above-described surface protective tape 3a, whereby to produce a 140 μm-total thick ultraviolet curable mask-integrated surface protective tape 3.

<Production of Semiconductor Chips>

The above-obtained ultraviolet curable mask-integrated surface protective tape was laminated on the surface of a silicon wafer (diameter: 8 inches) having thereon scribe lines (streets) using a laminator DR8500III (trade name, manufactured by Nitto Seiki Co., Ltd.).

After that, the face (wafer backing-face) opposite to the surface on which the above-described mask-integrated surface protective tape was laminated, was ground using DGP8760 (trade name, manufactured by DISCO Corporation) until a thickness of the wafer would be 50 μm. The ground wafer was mounted on a dicing tape (wafer-fixing tape) from the wafer backing-face side using RAD-2700F (trade name, manufactured by Lintec Corporation), and was supported and fixed to a ring frame (Step(a)).

After fixed the ring frame, by irradiating an ultraviolet ray of 500 mJ/cm$^2$ from the ultraviolet curable mask-integrated surface protective tape side using a high pressure mercury lamp, an adhesive force between the mask material layer 3b and the surface protective tape 3a was decreased, and only the surface protective tape 3a was peeled while leaving only the mask material layer 3b on the wafer.

Then, the mask material layer on the scribe lines was removed by a YAG laser having a wavelength region of 355 nm, to form an opening on the scribe lines (Step (b)).

After that, the silicon wafer was subjected to a plasma irradiation with a SF$_6$ gas as a plasma-generating gas from the mask material layer side at an etching speed of 15 μm/min for 5 minutes. By this plasma dicing, the wafer was cut and divided into individual chips (Step(c)).

Then, the chips were subjected to ashing with an O$_2$ gas as a plasma-generating gas at an etching speed of 1.5 μm/min for 10 minutes, thereby to remove the mask material layer 3b (Step(d)).

After that, an ultraviolet ray was irradiated (irradiation dose: 200 mJ/cm$^2$) from the dicing tape side, thereby to decrease an adhesive force of the dicing tape, and chips were picked up.

Example 2

A mask-integrated surface protective tape was prepared in the same manner as in Example 1, except that the blend amount of LA-F70 (ultraviolet absorber of triazine skeleton, manufactured by ADEKA K.K.) as a ultraviolet absorber for the mask material layer-forming composition B used in Example 1 was changed from 0.75 parts by mass to 1.5 parts by mass. Thus, semiconductor chips were produced in the same manner as in Example 1.

Example 3

A mask-integrated surface protective tape was prepared in the same manner as in Example 1, except that LA-F70 (ultraviolet absorber of triazine skeleton, manufactured by ADEKA K.K.) as a ultraviolet absorber for the mask material layer-forming composition B used in Example 1 was changed to LA-31 (ultraviolet absorber of triazole skeleton, manufactured by ADEKA K.K.) as a ultraviolet absorber, and that the blend amount of the ultraviolet absorber was changed from 0.75 parts by mass to 1.0 parts by mass. Thus, semiconductor chips were produced in the same manner as in Example 1.

Example 4

The mask material layer-forming composition B used in Example 1 was coated, without providing any temporary-adhesive layer 3ab formed in Example 1, on a peeling liner, so that a thickness after drying would be 10 μm, thereby to form a mask material layer 3b. By laminating the thus-formed mask material layer 3b directly on the substrate film used in Example 1 (the thickness 100 μm of a LDPE film), an ultraviolet curable mask-integrated surface protective tape having a total thickness of 110 μm was prepared. Thus, semiconductor chips were produced in the same manner as in Example 1.

Comparative Example 1

A mask-integrated surface protective tape was prepared in the same manner as in Example 1, except that, instead of the mask material layer-forming composition B used in Example 1, a mask material layer-forming composition was prepared and used, without addition of any ultraviolet absorber. Thus, semiconductor chips were produced in the same manner as in Example 1.

Comparative Example 2

A mask-integrated surface protective tape was prepared in the same manner as in Example 1, except that LA-F70

(ultraviolet absorber of triazine skeleton, manufactured by ADEKA K.K.) as a ultraviolet absorber for the mask material layer-forming composition B used in Example 1 was changed to LA-31 (ultraviolet absorber of triazole skeleton, manufactured by ADEKA K.K.) as a ultraviolet absorber, and that the blend amount of the ultraviolet absorber was changed from 0.75 parts by mass to 0.25 parts by mass. Thus, semiconductor chips were produced in the same manner as in Example 1.

Herein, in Comparative Examples 2, 3, 4 and 5, the parallel ray transmittance (%) of the ultraviolet absorbing material is too high to be outside of the range prescribed for the present invention. In this regard, the content of the ultraviolet absorbing material (for example, an ultraviolet absorbing polymer) has been changed to reduce it. This is because a small amount of said content results in a value "to give the parallel ray transmittance (%) that is too high (or the parallel ray absorption ratio (100%-transmittance) that is too low)".

Comparative Example 3

A mask-integrated surface protective tape was prepared in the same manner as in Example 1, except that the blend amount of LA-F70 (ultraviolet absorber of triazine skeleton, manufactured by ADEKA K.K.) as a ultraviolet absorber for the mask material layer-forming composition B used in Example 1 was changed from 0.75 parts by mass to 0.5 parts by mass. Thus, semiconductor chips were produced in the same manner as in Example 1.

Example 5

A mask-integrated surface protective tape was prepared in the same manner as in Example 1, except that LA-F70 (ultraviolet absorber having a triazine skeleton, manufactured by ADEKA K.K.) that was an ultraviolet absorber for the mask material layer-forming composition B used in Example 1 was replaced with VANARESIN UVA-5080 (manufactured by Shin-Nakamura Chemical Co., Ltd., mass-average molecular weight: 40,000 to 60,000, Tg: 80° C.) of the ultraviolet absorbing polymer having a triazine skeleton in the side chain, and that the blend amount thereof was changed from 0.75 parts by mass to 5.0 parts by mass. Thus, semiconductor chips were produced in the same manner as in Example 1.

Example 6

A mask-integrated surface protective tape was prepared in the same manner as in Example 1, except that LA-F70 (ultraviolet absorber having a triazine skeleton, manufactured by ADEKA K.K.) that was an ultraviolet absorber for the mask material layer-forming composition B used in Example 1 was replaced with VANARESIN UVA-5080 (manufactured by Shin-Nakamura Chemical Co., Ltd., mass-average molecular weight: 40,000 to 60,000, Tg: 80° C.) of the ultraviolet absorbing polymer having a triazine skeleton in the side chain, and that the blend amount thereof was changed from 0.75 parts by mass to 10.0 parts by mass. Thus, semiconductor chips were produced in the same manner as in Example 1.

Example 7

A mask-integrated surface protective tape was prepared in the same manner as in Example 1, except that LA-F70 (ultraviolet absorber having a triazine skeleton, manufactured by ADEKA K.K.) that was an ultraviolet absorber for the mask material layer-forming composition B used in Example 1 was replaced with VANARESIN UVA-7075 (manufactured by Shin-Nakamura Chemical Co., Ltd., mass-average molecular weight: 30,000 to 50,000, Tg: 75° C.) of the ultraviolet absorbing polymer having a triazole skeleton in the side chain, and that the blend amount thereof was changed from 0.75 parts by mass to 7.5 parts by mass. Thus, semiconductor chips were produced in the same manner as in Example 1.

Example 8

The mask material layer-forming composition used in Example 5 was coated, without providing any temporary-adhesive layer 3ab formed in Example 1, on a peeling liner, so that a thickness after drying would be 10 µm, thereby to form a mask material layer 3b. By laminating the thus-formed mask material layer 3b directly on the substrate film (the thickness 100 µm of a LDPE film) used in Example 1, an ultraviolet curable mask-integrated surface protective tape having a total thickness of 110 µm was prepared. Thus, semiconductor chips were produced in the same manner as in Example 1.

Comparative Example 4

A mask-integrated surface protective tape was prepared in the same manner as in Example 7, except that the blend amount of VANARESIN UVA-7075 [manufactured by Shin-Nakamura Chemical Co., Ltd., mass-average molecular weight: 30,000 to 50,000, Tg: 75° C.] of the ultraviolet absorbing polymer having a triazole skeleton in the side chain, which polymer was used in Example 7, was changed from 7.5 parts by mass to 3.0 parts by mass. Thus, semiconductor chips were produced in the same manner as in Example 1.

Comparative Example 5

A mask-integrated surface protective tape was prepared in the same manner as in Example 5, except that the blend amount of VANARESIN UVA-7075 [manufactured by Shin-Nakamura Chemical Co., Ltd., mass-average molecular weight: 30,000 to 50,000, Tg: 75° C.] of the ultraviolet absorbing polymer having a triazole skeleton in the side chain, which polymer was used in Example 5, was changed from 5.0 parts by mass to 2.5 parts by mass. Thus, semiconductor chips were produced in the same manner as in Example 1.

Herein, LA-F70 and LA-31 of the ultraviolet absorbers (each manufactured by ADEKA K.K.), and VANARESIN UVA-5080 and VANARESIN UVA-7075 of the ultraviolet absorbing polymers (each manufactured by Shin-Nakamura Chemical Co., Ltd.) have the following chemical structures, respectively.

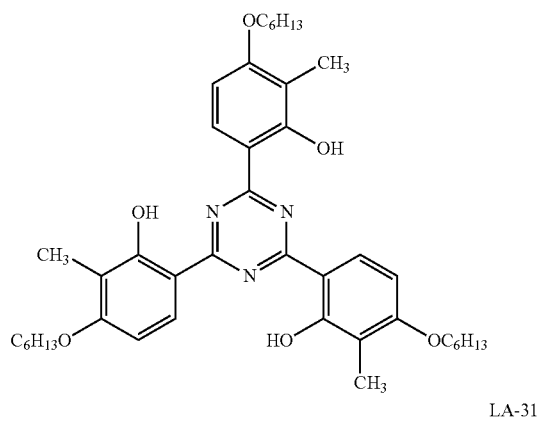

LA-F70

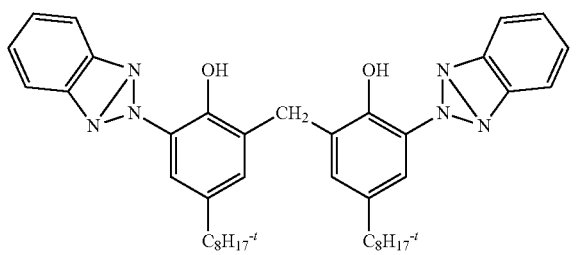

LA-31

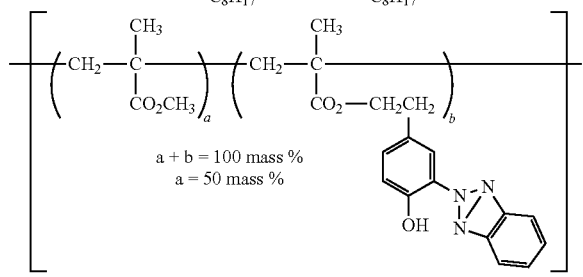

VANARESIN UVA-5080

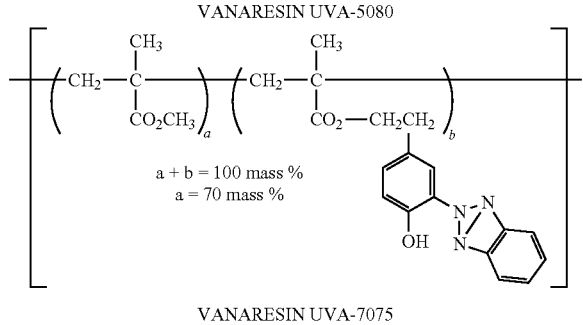

VANARESIN UVA-7075

<Characteristics and Performance Evaluation>

The parallel ray absorption rate of each mask material layer 3b so obtained was measured and calculated as in the following Test Example 1.

Further, in Examples 1 to 3 and 5 to 7, and Comparative Examples 1 to 5, a peeling property evaluation of the surface protective tape 3a to be peeled was performed as in the following Test Example 2. Furthermore, in Examples 4 and 8, a peeling property evaluation of the substrate film 3a to be peeled was performed as in the following Test Example 2.

Further, evaluations of both a cutting property at the wafer street portion and a removal property of the mask material layer, of each mask-integrated surface protective tape, thus-prepared in Examples 1 to 8 and Comparative Examples 1 to 5, were performed as in the following Test Examples 3 and 4.

[Test Example 1] Evaluation of Parallel Ray Transmittance Rate of the Mask Material Layer The parallel ray transmittance rate of the mask material layer at wavelength region of 355 nm was measured by the following method. With respect to each of the mask material layers formed on a release liner, which were obtained by Examples and Comparative Examples, a parallel ray transmittance rate at the wavelength region of 355 nm from the backing side of the release liner without the mask material layer formed, was measured, using an ultraviolet and visible spectrophotometer UV-1800 (manufactured by Shimadzu Corporation). This instrument is an instrument having a light receiving section of integrating sphere system by which a total light transmittance can be measured. However, the parallel ray transmittance can be measured, by distancing the fixed position of the sample from a light entrance window of the integrating sphere by 70 mm.

Meanwhile, the parallel ray transmittance of the mask material layer is a value obtained by measurement at the thickness of the mask material layer thus prepared.

[Test Example 2] Peeling Property Evaluation of the Surface Protective Tape or Substrate Film The force (peel force) required when each surface protective tape in Examples 1 to 3, 5 to 7 and Comparative Examples 1 to 5 and each substrate film in Examples 4 and 8 were peeled off in the Step (b) of the above-described production steps of the semiconductor chip was evaluated according to evaluation criteria. Meanwhile, evaluation of the peeling property of the above-described surface protective tape and substrate film was conducted using RAD-2700F (trade name, manufactured by Lintech Corporation).

—Criterion for Evaluation of Peeling Property of the Surface Protective Tape or Substrate Film—

⊚: Only the surface protective tape or substrate film could be simply peeled with a weak force (1.5 kgf or less).

○: A strongish force was required for peeling (2.5 kgf or less), but only the surface protective tape or substrate film could be peeled.

x: The surface protective tape or substrate film could not be peeled. Alternatively, the surface protective tape or substrate film was peeled together with the mask material layer.

[Test Example 3] Cutting Property of the Wafer Street Portion with Laser Irradiation In the above-described Step (c) of the production steps of the semiconductor chip, by irradiating a YAG laser of 355 nm to the mask material layer in each of Examples and Comparative Examples, a portion of the mask material layer corresponding to the street was removed, and a cutting property at the time of opening of the semiconductor wafer street was evaluated according to the following criterion.

Specifically, a laser light was irradiated, using a Galvanometer scanner, by focusing the third harmonic wave of YAG laser (355 nm) having an average output of 2.5 W and a cyclic frequency of 1 kHz on a silicon wafer surface to 25 μm diameter with a f 0 lens.

The laser irradiation was scanned at a speed of 2.5 mm/sec and a portion of the mask material layer corresponding to a street was removed by repeating the laser irradiation once per line, thereby to evaluate a cutting property at the time of opening the street of the semiconductor wafer.

—Evaluation Criterion of Cutting Property of Wafer Street Portion by Laser Irradiation—

⊙: Opening of the street was possible, and a residue of the mask material layer was not formed.

○: Opening of the street was possible, but a residue of the mask material layer was formed.

Δ: Opening of the street was possible in more than half thereof, but the part where the mask material layer could not be removed, occurred.

x: The mask material layer could not be removed, so that opening of the street was impossible.

[Test Example 4] Removal Property Evaluation of the Mask Material Layer by $O_2$ Plasma Ashing In the Step (d) of the above-described production steps of the semiconductor chips, presence or absence of the residue of the mask material of the mask material layer after $O_2$ plasma ashing (ashing for 10 minutes at the etching speed of 1.5 μm/min) in each of Examples and Comparative Examples, was examined in 3-dimensional information (magnifying power of 400 times) in a range of 640 μm in horizontal size by 480 μm in vertical size of the face, using a laser microscope (trade name: VK-X100, manufactured by Keyence Corporation).

—Criterion for Removal Property Evaluation of the Mask Material Layer—

○: No residue of the mask material layer is observed (absence of residue).

x: The residue of the mask material layer is apparently observed (presence of residue)

The results obtained in the Test Examples 1 to 4 are shown in Tables 1 and 2.

Note that Comparative Example 1 in Table 2 is identical to Comparative Example 1 in Table 1.

Herein, the expression "-" means unused.

TABLE 1

|  | Ex. 1 | Ex. 2 | Ex. 3 | Ex. 4 | CEx 1 | CEx 2 | CEx. 3 |
|---|---|---|---|---|---|---|---|
| Layer structure: presence or absence of the temporary-adhesive layer | Presence | Presence | Presence | Absence | Presence | Presence | Presence |
| Ultraviolet-absorbing material | LA-F70 | LA-F70 | LA-31 | LA-F70 | — | LA-31 | LA-F70 |
| Parallel ray transmittance (%) at 355 nm | 27% | 10% | 21% | 27% | 95% | 65% | 35% |
| Peeling property of the surface protective tape or substrate film | ○ | ○ | ○ | ⊙ | ○ | ○ | ○ |
| Cutting property of the wafer street portion with laser irradiation | ○ | ⊙ | ○ | ○ | X | X | Δ |
| Presence or absence of the mask agent removal by plasma | ○ | ○ | ○ | ○ | ○ | ○ | ○ |

Remarks: 'Ex' means Example according to this invention; and 'CEx' means Comparative Example.

TABLE 2

|  | Ex. 5 | Ex. 6 | Ex. 7 | Ex. 8 | CEx 1 | CEx.4 | CEx.5 |
|---|---|---|---|---|---|---|---|
| Layer structure: presence or absence of the temporary-adhesive layer | Presence | Presence | Presence | Absence | Presence | Presence | Presence |
| Ultraviolet-absorbing material | UVA-5080 | UVA-5080 | UVA-7075 | UVA-5080 | — | UVA-7075 | UVA-5080 |
| Parallel ray transmittance (%) at 355 nm | 29% | 12% | 22% | 29% | 95% | 67% | 37% |

TABLE 2-continued

|  | Ex. 5 | Ex. 6 | Ex. 7 | Ex. 8 | CEx 1 | CEx.4 | CEx.5 |
|---|---|---|---|---|---|---|---|
| Peeling property of the surface protective tape or substrate film | ○ | ○ | ○ | ⊙ | ○ | ○ | ○ |
| Cutting property of the wafer street portion with laser irradiation | ○ | ⊙ | ○ | ○ | X | X | Δ |
| Presence or absence of the mask agent removal by plasma | ○ | ○ | ○ | ○ | ○ | ○ | ○ |

From the results of each Test Example in the Examples 1 to 8 and Comparative Examples 1 to 5, it is found that a mask can be formed simply, without causing any adhesive deposit (or any adhesive residue), by using the mask-integrated surface protective tape of the present invention at the time of processing a semiconductor wafer to produce a semiconductor chip, and by laminating the mask-integrated surface protective tape 3 on a patterned surface of the semiconductor wafer, and only by peeling the surface protective tape 3a, or in a case of having the mask material layer 3b directly on the substrate film, only by peeling the substrate film 3a, from the thus-laminated mask-integrated surface protective tape 3.

Furthermore, it is found that an opening of the street of the semiconductor wafer is formed, without any problem, with a laser irradiation, by using the mask-integrated surface protective tape of the present invention, and further the mask material layer 3b can be removed with more certainty, by an $O_2$ plasma, whereby occurrence of defective chips can be highly suppressed.

In contrast to the above, in Comparative Examples 1 to 5 in which the parallel ray transmittance of the mask material layer in a wavelength region of 355 nm was more than 30%, the cuttability at the time of opening the street portion of the semiconductor wafer by laser irradiation became worse, according to more than 30%.

Having described our invention as related to the present embodiments, it is our intention that the invention not be limited by any of the details of the description, unless otherwise specified, but rather be construed broadly within its spirit and scope as set out in the accompanying claims.

What is claimed is:

1. A mask-integrated surface protective tape, comprising a substrate film and a mask material layer,
    wherein the mask material layer is attached to the substrate film through an adhesive layer interposed therebetween, and
    wherein a parallel ray transmittance of the mask material layer at a wavelength of 355 nm is 30% or less,
    wherein the mask material layer includes a (meth)acrylic copolymer as well as one of the following materials (i) to (iv):

(i) an ultraviolet absorber of triazine skeleton represented by the following formula:

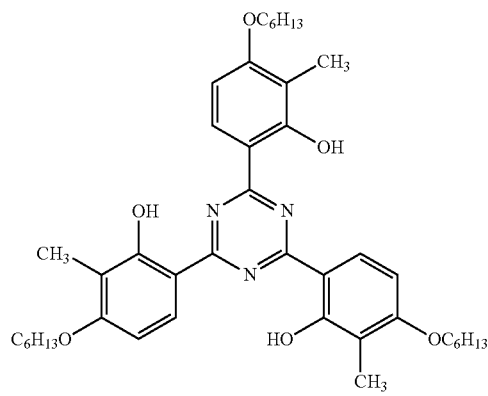

(ii) an ultraviolet absorber of triazole skeleton represented by the following formula:

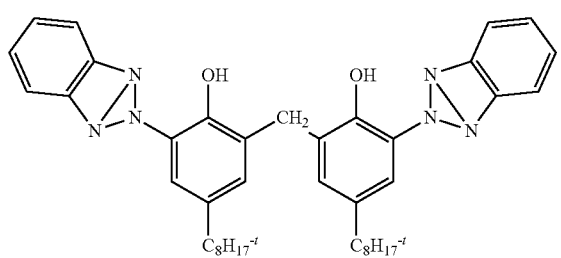

(iii) an ultraviolet absorbing polymer having a triazine skeleton in the side chain represented by the following formula:

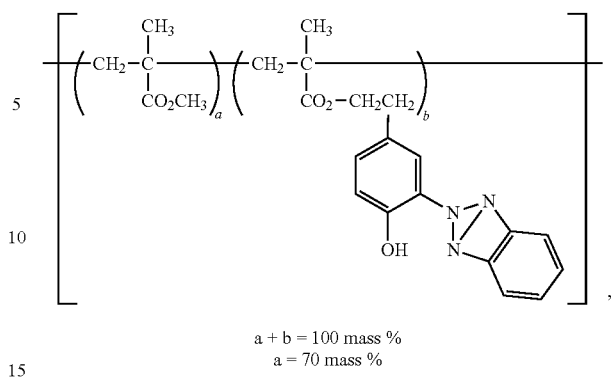

a + b = 100 mass %
a = 70 mass %

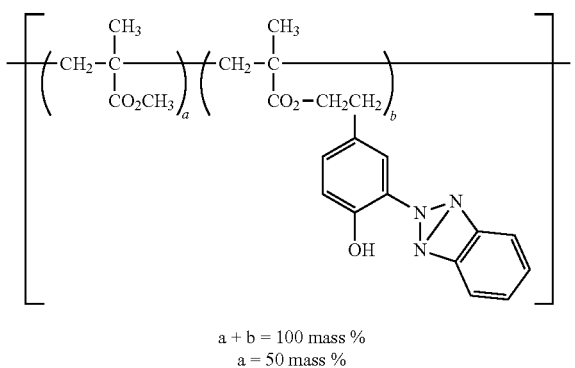

a + b = 100 mass %
a = 50 mass %

(iv) an ultraviolet absorbing polymer having a triazole skeleton in the side chain represented by the following formula and
wherein:
(a) in the case that the mask material layer includes one of materials (i) and (ii), a content thereof is from 0.1 to 5.0 mass parts with respect to 100 mass parts of the (meth)acrylic copolymer so that the parallel ray transmittance of the mask material layer at a wavelength of 355 nm becomes 30% or less, and
(b) in the case that the mask material layer includes one of the materials (iii) and (iv), a content thereof is from 5.0 to 50.0 mass parts with respect to 100 mass parts of the (meth)acrylic copolymer so that the parallel ray transmittance of the mask material layer at a wavelength of 355 nm becomes 30% or less.

2. The mask-integrated surface protective tape according to claim 1, wherein a mask material constituting the mask material layer is radiation-curable.

3. The mask-integrated surface protective tape according to claim 1, wherein an adhesive that constitutes said adhesive layer is of a pressure-sensitive type.

4. The mask-integrated surface protective tape according to claim 1, wherein the substrate film comprises a polyolefin-based resin layer.

* * * * *